(12) United States Patent
Ishii et al.

(10) Patent No.: US 12,339,241 B2
(45) Date of Patent: Jun. 24, 2025

(54) MULTIPLE SECONDARY ELECTRON BEAM ALIGNMENT METHOD, MULTIPLE SECONDARY ELECTRON BEAM ALIGNMENT APPARATUS, AND ELECTRON BEAM INSPECTION APPARATUS

(71) Applicant: NuFlare Technology, Inc., Yokohama (JP)

(72) Inventors: Koichi Ishii, Kawasaki (JP); Atsushi Ando, Edogawa-ku (JP)

(73) Assignee: NuFlare Technology, Inc., Yokohama (JP)

( * ) Notice: Subject to any disclaimer, the term of this patent is extended or adjusted under 35 U.S.C. 154(b) by 596 days.

(21) Appl. No.: 17/658,557

(22) Filed: Apr. 8, 2022

(65) Prior Publication Data

US 2022/0365010 A1    Nov. 17, 2022

(30) Foreign Application Priority Data

May 11, 2021  (JP) .............................. 2021-080643
Jan. 11, 2022  (JP) .............................. 2022-002324

(51) Int. Cl.
*G01N 23/225* (2018.01)

(52) U.S. Cl.
CPC ....... *G01N 23/225* (2013.01); *G01N 2223/07* (2013.01); *G01N 2223/3303* (2013.01); *G01N 2223/646* (2013.01)

(58) Field of Classification Search
CPC .. H01J 37/00; H01J 37/02; H01J 37/26; H01J 37/28; H01J 37/244; H01J 37/22;
(Continued)

(56) References Cited

U.S. PATENT DOCUMENTS 9,035,249 B1 *   5/2015  Frosien ................. H01J 37/244
                                                250/311
2019/0214221 A1 *  7/2019  Ishii ..................... H01J 37/244
(Continued)

FOREIGN PATENT DOCUMENTS

JP    2014-26834 A    2/2014
JP    2021-131946 A   9/2021

*Primary Examiner* — Jason L McCormack
(74) *Attorney, Agent, or Firm* — Oblon, McClelland, Maier & Neustadt, L.L.P.

(57) ABSTRACT

A multiple secondary electron beam alignment method includes scanning a plurality of first detection elements of a multi-detector, which are arrayed in a grid, with multiple secondary electron beams emitted from a surface of a target object on a stage, detecting a plurality of beams including a corner beam located at a corner in the multiple secondary electron beams by the multi-detector, calculating a positional relationship between the plurality of beams including the corner beam and a plurality of second detection elements, which have detected the plurality of beams including the corner beam, in the plurality of first detection elements, calculating, based on the positional relationship, a shift amount for aligning the plurality of first detection elements with the multiple secondary electron beams, and moving, using the shift amount, the multi-detector relatively to the multiple secondary electron beams.

11 Claims, 29 Drawing Sheets

(58) Field of Classification Search
CPC ............. G01N 23/225; G01N 2223/07; G01N 2223/3303; G01N 2223/646; G01N 2223/053; G01N 2223/055; G01N 2223/2446; G01N 21/8851
USPC ................................. 250/306, 307, 310, 311
See application file for complete search history.

(56) References Cited

U.S. PATENT DOCUMENTS

2019/0355545 A1\* 11/2019 Zeidler .................... H01J 37/21
2019/0362928 A1\* 11/2019 Inoue ..................... H01J 37/141

\* cited by examiner (1) $$\begin{bmatrix} r_x \\ r_y \\ 1 \\ 1 \end{bmatrix} = \begin{bmatrix} 1-\cos\varphi & \sin\varphi & x_1\cos\varphi - y_1\sin\varphi & 0 \\ -\sin\varphi & 1-\cos\varphi & 0 & x_1\sin\varphi + y_1\cos\varphi \\ 1-\cos\varphi & \sin\varphi & x_2\cos\varphi - y_2\sin\varphi & 0 \\ -\sin\varphi & 1-\cos\varphi & 0 & x_2\sin\varphi + y_2\cos\varphi \\ \vdots & \vdots & \vdots & \vdots \\ 1-\cos\varphi & \sin\varphi & x_n\cos\varphi - y_n\sin\varphi & 0 \\ -\sin\varphi & 1-\cos\varphi & 0 & x_n\sin\varphi + y_n\cos\varphi \end{bmatrix}^{-1} \begin{bmatrix} X_1 \\ Y_1 \\ X_2 \\ Y_2 \\ \vdots \\ X_n \\ Y_n \end{bmatrix}$$

$(x_1,y_1),(x_2,y_2), \cdots ,(x_n,y_n)$ : Coordinates of PD before Rotation $(X_1,Y_1),(X_2,Y_2), \cdots ,(X_n,Y_n)$ : Coordinates of PD after Rotation $\phi$ : Rotation Angle

FIG.16

$$(3) \quad \begin{bmatrix} \alpha \\ \beta \end{bmatrix} = \begin{bmatrix} P_x & Q_x \\ P_y & Q_y \end{bmatrix}^{-1} \begin{bmatrix} R_x \\ R_y \end{bmatrix}$$

FIG.18

$$(4) \quad \begin{bmatrix} X \\ Y \end{bmatrix} = \begin{bmatrix} \cos\theta & -\sin\theta \\ \sin\theta & \cos\theta \end{bmatrix} \begin{bmatrix} x - r_x \\ y - r_y \end{bmatrix} + \begin{bmatrix} r_x \\ r_y \end{bmatrix} = \begin{bmatrix} -y + r_y & x - r_x & r_x \\ x - r_x & y - r_y & r_y \end{bmatrix} \begin{bmatrix} \sin\theta \\ \cos\theta \\ 1 \end{bmatrix}$$

FIG.20

MULTIPLE SECONDARY ELECTRON BEAM ALIGNMENT METHOD, MULTIPLE SECONDARY ELECTRON BEAM ALIGNMENT APPARATUS, AND ELECTRON BEAM INSPECTION APPARATUS

CROSS-REFERENCE TO RELATED APPLICATION

This application is based upon and claims the benefit of priority from prior Japanese Patent Application No. 2021-080643 filed on May 11, 2021 in Japan, and prior Japanese Patent Application No. 2022-002324 filed on Jan. 11, 2022 in Japan, the entire contents of which are incorporated herein by reference.

BACKGROUND OF THE INVENTION

Field of the Invention

An embodiment of the present invention relates to an alignment method for multiple secondary electron beams, an alignment apparatus for multiple secondary electron beams, and an electron beam inspection apparatus, and for example, relates to a method for acquiring an image by applying multiple primary electron beams to a substrate and detecting multiple secondary electron beams emitted from the substrate due to irradiation with the multiple primary electron beams.

Description of Related Art

With recent progress in high integration and large capacity of the LSI (Large Scale Integrated circuits), the line width (critical dimension) required for circuits of semiconductor elements is becoming increasingly narrower. Since LSI manufacturing requires an enormous production cost, it is essential to improve the yield. Meanwhile, as typified by 1 gigabit DRAMs (Dynamic Random Access Memories), the size of patterns which make up LSI is reduced from the order of submicrons to nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on a mask for exposing/transferring an ultrafine pattern onto the semiconductor wafer by the photolithography technology. Therefore, the pattern inspection apparatus for inspecting defects on an exposure transfer mask used in manufacturing LSI also needs to be highly accurate.

The inspection apparatus acquires a pattern image by, for example, irradiating an inspection target substrate with multiple electron beams and detecting a secondary electron corresponding to each beam emitted from the inspection target substrate. As an inspection method, there is known a method of comparing a measured image acquired by imaging a pattern formed on a substrate with design data or with another measured image acquired by imaging an identical pattern on the same substrate. For example, as a pattern inspection method, there is "die-to-die inspection" or "die-to-database inspection". Specifically, the "die-to-die inspection" method compares data of measured images acquired by imaging identical patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

In the multi-beam inspection apparatus, if the number of multiple beams and the number of elements of the secondary electron detector are the same in the system, it is important to perform alignment (positioning) between the multiple beams and the elements. In particular, when a secondary electron detector is installed as a new one or an exchange one in the inspection apparatus, alignment with multiple secondary electron beams is important. For example, there is disclosed a method where an aperture plate is arranged between the last stage lens of the secondary optical system lens and the secondary electron detector in order to use it for position adjustment of secondary electron beams (refer to, e.g., Japanese Patent Application Laid-open (JP-A) No. 2014-026834).

BRIEF SUMMARY OF THE INVENTION

According to one aspect of the present invention, a multiple secondary electron beam alignment method includes scanning a plurality of first detection elements of a multi-detector, which are arrayed in a grid, with multiple secondary electron beams emitted from a surface of a target object on a stage, detecting a plurality of beams including a corner beam located at a corner in the multiple secondary electron beams by the multi-detector, calculating a positional relationship between the plurality of beams including the corner beam and a plurality of second detection elements, which have detected the plurality of beams including the corner beam, in the plurality of first detection elements, calculating, based on the positional relationship, a shift amount for aligning the plurality of first detection elements with the multiple secondary electron beams, and moving, using the shift amount, the multi-detector relatively to the multiple secondary electron beams.

According to another aspect of the present invention, a multiple secondary electron beam alignment apparatus includes a stage, an electron optical system configured to irradiate a surface of a target object on the stage with multiple primary electron beams, a multi-detector configured to include a plurality of first detection elements arrayed in a grid, and to detect a plurality of beams including a corner beam located at a corner in multiple secondary electron beams emitted from the surface of the target object due to irradiation with the multiple primary electron beams, a deflector configured to scan the plurality of first detection elements with the multiple secondary electron beams, a positional relationship calculation circuit configured to calculate a positional relationship between the plurality of beams including the corner beam and a plurality of second detection elements, which have detected the plurality of beams, in the plurality of first detection elements, a shift amount calculation circuit configured to calculate, based on the positional relationship, a shift amount for aligning the plurality of first detection elements with the multiple secondary electron beams, and a movement mechanism configured to move, using the shift amount, the multi-detector relatively to the multiple secondary electron beams.

According to yet another aspect of the present invention, an electron beam inspection apparatus includes a stage, an electron optical system configured to irradiate a surface of a target object on the stage with multiple primary electron beams, a multi-detector configured to include a plurality of first detection elements arrayed in a grid, and to detect a plurality of beams including a corner beam located at a corner in multiple secondary electron beams emitted from the surface of the target object due to irradiation with the multiple primary electron beams, a deflector configured to scan the plurality of first detection elements with the multiple secondary electron beams, a positional relationship calculation circuit configured to calculate a positional relationship between the plurality of beams including the corner beam and a plurality of second detection elements, which have detected the plurality of beams, in the plurality of first detection elements, a shift amount calculation circuit configured to calculate, based on the positional relationship, a shift amount for aligning the plurality of first detection elements with the multiple secondary electron beams, a movement mechanism configured to move, using the shift amount, the multi-detector relatively to the multiple secondary electron beams, and a comparison circuit configured to compare a secondary electron image of an inspection substrate placed on the stage with a predetermined image, wherein the secondary electron image is acquired by irradiating the inspection substrate on the stage with multiple primary electron beams, and detecting, by the multi-detector, the multiple secondary electron beams emitted from the inspection substrate due to the irradiating with the multiple primary electron beams.

BRIEF DESCRIPTION OF THE DRAWINGS

FIG. 16 is an equation for calculating rotation center coordinates according to the first embodiment;

FIG. 18 is an equation for calculating a vector coefficient according to the first embodiment;

FIG. 20 is an equation for calculating an alignment angle according to the first embodiment;

DETAILED DESCRIPTION OF THE INVENTION

Hereinafter, embodiments of the present invention describe a method by which alignment between multiple charged particle beams and a secondary electron detector can be performed, and an apparatus capable of realizing the method.

The embodiments below describe, as an example of an alignment apparatus for multiple secondary electron beams, an inspection apparatus using multiple electron beams. However, it is not limited thereto. Any apparatus can be used as long as it applies multiple primary electron beams to a substrate and performs alignment between multiple secondary electron beams emitted from the substrate and a multi-detector. For example, the apparatus can be an image acquisition apparatus that acquires images by irradiating a substrate with multiple primary electron beams in order to use multiple secondary electron beams emitted from the substrate due to the irradiation.

First Embodiment

Figure 1:
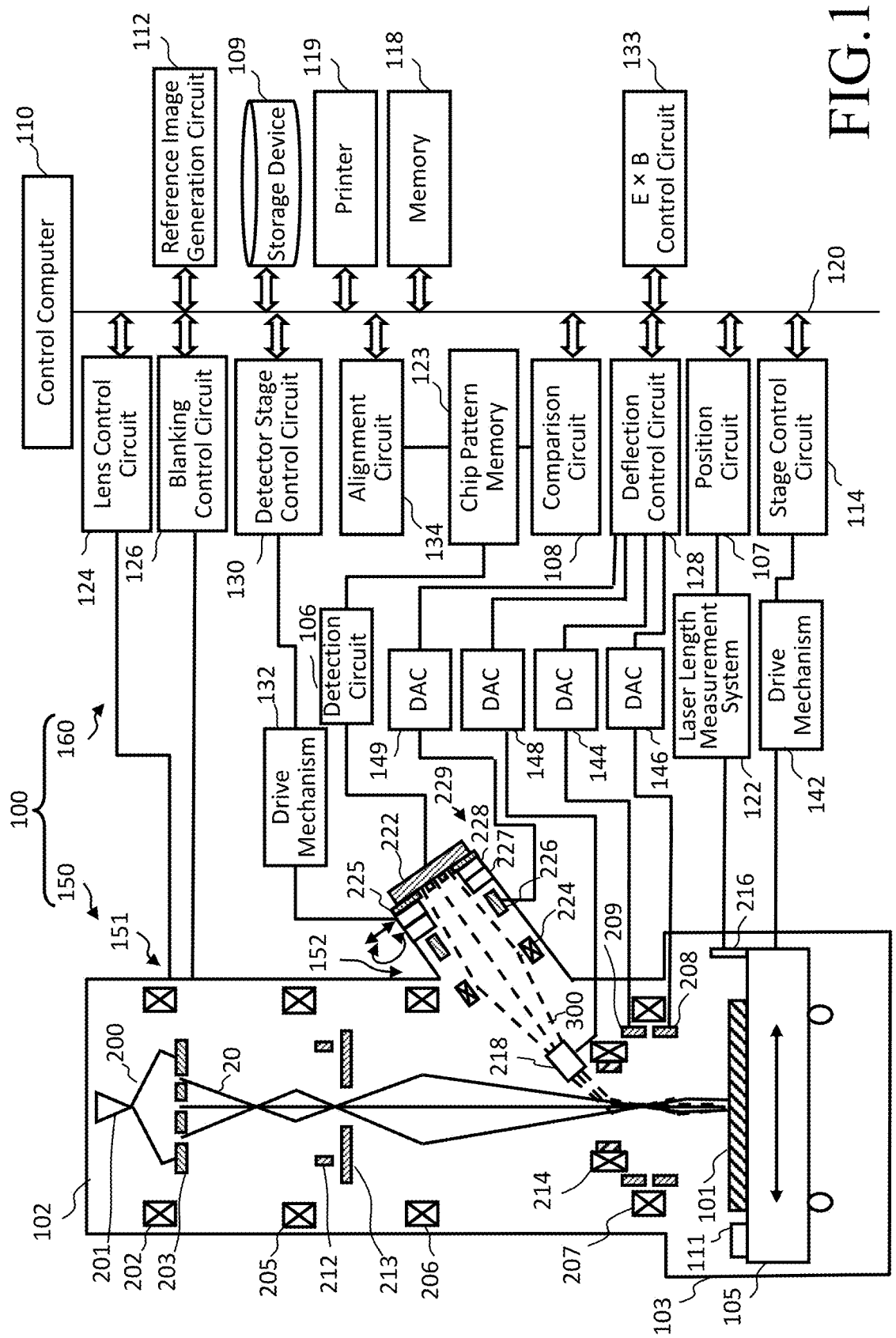
FIG. 1 is a diagram showing a configuration of an inspection apparatus according to a first embodiment.

FIG. 1 is a diagram showing an example of a configuration of an inspection apparatus according to a first embodiment. In FIG. 1, an inspection apparatus 100 for inspecting a pattern formed on the substrate is an example of a multi-electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a bundle blanking deflector 212, a limiting aperture substrate 213, an electromagnetic lens 206, an electromagnetic lens 207 (objective lens), a main deflector 208, a sub deflector 209, an E×B separator 214 (beam separator), a deflector 218, an electromagnetic lens 224, a deflector 226, a detector stage 229, a detector aperture array substrate 225, and a multi-detector 222. A primary electron optical system 151 (illumination optical system) is composed of the electron gun 201, the electromagnetic lens 202, the shaping aperture array substrate 203, the electromagnetic lens 205, the bundle blanking deflector 212, the limiting aperture substrate 213, the electromagnetic lens 206, the electromagnetic lens 207 (objective lens), the main deflector 208, and the sub deflector 209. A secondary electron optical system 152 (detecting optical system) is composed of the electromagnetic lens 207, the E×B separator 214, the deflector 218, the electromagnetic lens 224, and the deflector 226. The multi-detector 222 is arranged on the detector stage 229 which is movable in the x and y directions in the secondary coordinate system, and a rotation (θ) direction. The detector stage 229 includes a rotary stage 227, and an X-Y stage 228 of the secondary coordinate system for secondary electron beams.

In the inspection chamber 103, there is disposed a stage 105 movable at least in the x and y directions. On the stage 105, a substrate 101 (target object) to be inspected is placed. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. By exposing/transferring a chip pattern formed on the exposure mask substrate onto the semiconductor substrate a plurality of times, a plurality of chip patterns (wafer dies) are formed on the semiconductor substrate. The case of the substrate 101 being a semiconductor substrate is mainly described below. The substrate 101 is placed, with its pattern-forming surface facing upward, on the stage 105, for example. Further, on the stage 105, there is disposed a mirror 216 which reflects a laser beam for measuring a laser length emitted from a laser length measuring system 122 arranged outside the inspection chamber 103. Furthermore, on the XY stage 105, a mark 111 adjusted to be flush in height with the surface of the substrate 101 is arranged. For example, a cross pattern is formed as the mark 111.

The multi-detector 222 is connected, at the outside of the electron beam column 102, to a detection circuit 106. The detection circuit 106 is connected to a chip pattern memory 123.

The multi-detector 222 includes a plurality of detection elements arranged in a grid-like array. In the detector aperture array substrate 225, a plurality of openings are formed at the array pitch of the plurality of detection elements. Each of the plurality of openings is a circle, for example. The center position of each opening is formed to correspond to the center position of a corresponding detection element. The size of the opening is smaller than that of the electron detection surface region of the detection element.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a detector stage control circuit 130, an E×B control circuit 133, an alignment circuit 134, a storage device 109 such as a magnetic disk drive, a memory 118, and a printer 119. The deflection control circuit 128 is connected to DAC (digital-to-analog conversion) amplifiers 144, 146, 148 and 149. The DAC amplifier 146 is connected to the main deflector 208, the DAC amplifier 144 is connected to the sub deflector 209, the DAC amplifier 148 is connected to the deflector 218, and the DAC amplifier 149 is connected to the deflector 226.

The chip pattern memory 123 is connected to the comparison circuit 108 and the alignment circuit 134. The stage 105 is driven by a drive mechanism 142 under the control of the stage control circuit 114. In the drive mechanism 142, for example, a drive system such as a three (x-, y-, and θ-) axis motor which provides drive in the directions of x, y, and θ in the stage coordinate system is configured, and thus the stage 105 can move in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. With respect to the stage coordinate system, the x, y, and θ directions of the primary coordinate system are set, for example, to a plane perpendicular to the optical axis of multiple primary electron beams 20.

The detector stage 229 is driven by a drive mechanism 132 under the control of the detector stage control circuit 130. In the drive mechanism 132, for example, a drive system such as a three (x-, y-, and θ-) axis motor which provides drive in the directions of x, y, and θ in the stage coordinate system is configured, and thus the X-Y stage 228 can move in the x and y directions and the rotary stage 227 can move in the θ direction. FIG. 1 shows the case where the X-Y stage 228 is arranged on the rotary stage 227. A step motor, for example, can be used as each of these x, y, and θ motors (not shown). The detector stage 229 is movable in the horizontal direction and the rotation direction by the x-, y-, and θ-axis motors. With respect to the stage coordinate system, the x, y, and θ directions of the secondary coordinate system are set, for example, to a plane perpendicular to the optical axis of multiple secondary electron beams 300.

The electromagnetic lenses 202, 205, 206, 207, and 224 are controlled by the lens control circuit 124. The E×B separator 214 is controlled by the E×B control circuit 133. The bundle blanking deflector 212 is an electrostatic deflector composed of two or more electrodes (or poles), and each electrode is controlled by the blanking control circuit 126 through a DAC amplifier (not shown). The sub deflector 209 is an electrostatic deflector composed of four or more electrodes (or poles), and each electrode is controlled by the deflection control circuit 128 through the DAC amplifier 144. The main deflector 208 is an electrostatic deflector composed of four or more electrodes (or poles), and each electrode is controlled by the deflection control circuit 128 through the DAC amplifier 146. The deflector 218 is an electrostatic deflector composed of four or more electrodes (or poles), and each electrode is controlled by the deflection control circuit 128 through the DAC amplifier 148. The deflector 226 is an electrostatic deflector composed of four or more electrodes (or poles), and each electrode is controlled by the deflection control circuit 128 through the DAC amplifier 149.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 1 shows configuration elements necessary for describing the first embodiment. Other configuration elements generally necessary for the inspection apparatus 100 may also be included therein.

Figure 2:
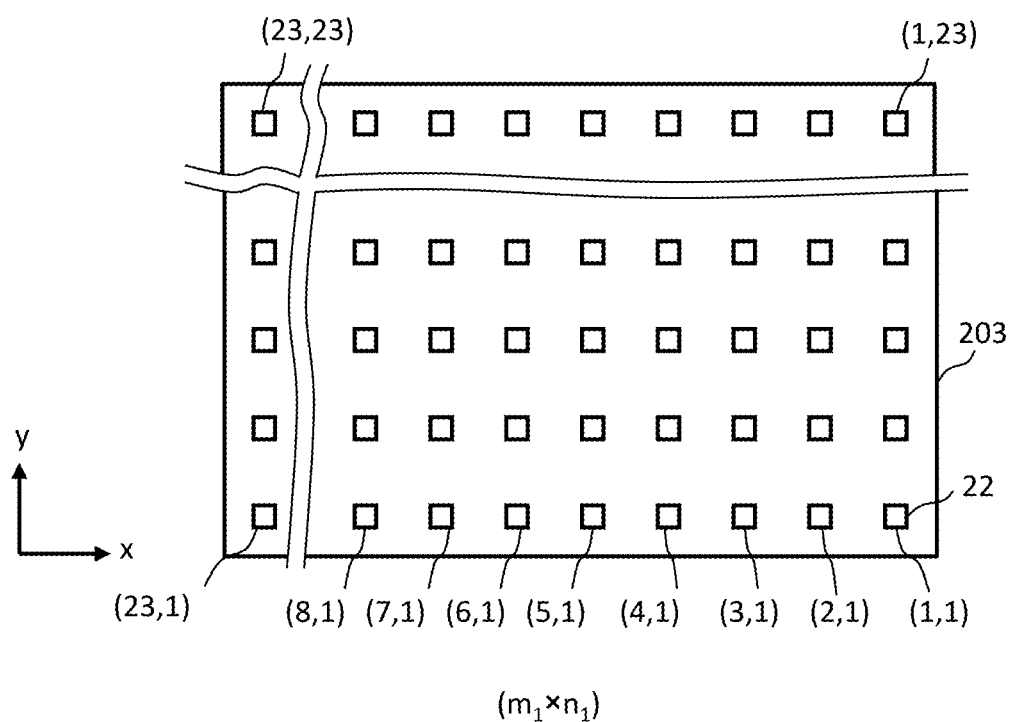
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (width in the x direction) and $n_1$ rows long (length in the y direction), where each of $m_1$ and $n_1$ is an integer of 2 or more, are two-dimensionally formed in the x and y directions at a predetermined arrangement pitch in the shaping aperture array substrate 203. In the case of FIG. 2, 23×23 holes (openings) 22 are formed. Each of the holes 22 is a rectangle (including a square) having the same dimension, shape, and size. Alternatively, each of the holes 22 may be a circle with the same outer diameter. The multiple primary electron beams 20 are formed by letting portions of the electron beam 200 individually pass through a corresponding one of the plurality of holes 22. Next, operations of the image acquisition mechanism 150 when acquiring a secondary electron image will be described below. In the primary electron optical system 151, the substrate 101 is irradiated with the multiple primary electron beams 20. Specifically, it operates as follows:

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all the plurality of holes 22 is irradiated with the electron beam 200. The multiple primary electron beams 20 are formed by letting portions of the electron beam 200 applied to the positions of the plurality of holes 22 individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens), while repeating forming an intermediate image and a crossover, passing through the E×B separator 214 disposed arranged on the intermediate image plane of each beam of the multiple primary electron beams 20.

When the multiple primary electron beams 20 are incident on the electromagnetic lens 207 (objective lens), the electromagnetic lens 207 focuses the multiple primary electron beams 20 onto the substrate 101. The multiple primary electron beams 20 having been focused on the substrate 101 (target object) by the electromagnetic lens 207 are collectively deflected by the main deflector 208 and the sub deflector 209 to irradiate respective beam irradiation positions on the substrate 101. In the case where all of the multiple primary electron beams 20 are collectively deflected by the bundle blanking deflector 212, they deviate from the hole in the center of the limiting aperture substrate 213 and are blocked by the limiting aperture substrate 213. On the other hand, the multiple primary electron beams 20 which were not deflected by the bundle blanking deflector 212 pass through the hole in the center of the limiting aperture substrate 213 as shown in FIG. 1. Blanking control is provided by On/Off of the bundle blanking deflector 212, and thus On/Off of the multiple beams is collectively controlled. In this way, the limiting aperture substrate 213 blocks the multiple primary electron beams 20 which were deflected to be in an "Off condition" by the bundle blanking deflector 212. Then, the multiple primary electron beams 20 for image acquisition are formed by the beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons, each corresponding to each of the multiple primary electron beams 20, is emitted from the substrate 101 due to the irradiation with the multiple primary electron beams 20.

The multiple secondary electron beams 300 emitted from the substrate 101 travel to the E×B separator 214 through the electromagnetic lens 207. The E×B separator 214 includes a plurality of, at least two, magnetic poles each having a coil, and a plurality of, at least two, electrodes (poles). For example, the E×B separator 214 includes four magnetic poles (magnetic deflection coils) whose phases are mutually shifted by 90°, and four electrodes (electrostatic deflection electrodes) whose phases are also mutually shifted by 90°. For example, by setting two opposing magnetic poles to be an N pole and an S pole, a directive magnetic field is generated by the plurality of magnetic poles. Also, for example, by applying electrical potentials V whose signs are opposite to each other to two opposing electrodes, a directive electric field is generated by the plurality of electrodes. Specifically, the E×B separator 214 generates an electric field and a magnetic field to be perpendicular to each other in a plane orthogonal to the traveling direction of the center beam (i.e., trajectory center axis) of the multiple primary electron beams 20. The electric field exerts a force in a fixed direction regardless of the traveling direction of electrons. In contrast, the magnetic field exerts a force according to Fleming's left-hand rule. Therefore, the direction of force acting on electrons can be changed depending on the entering (or "traveling") direction of electrons. With respect to the multiple primary electron beams 20 entering the E×B separator 214 from above, since the forces due to the electric field and the magnetic field cancel each other out, the beams 20 travel straight downward. In contrast, with respect to the multiple secondary electron beams 300 entering the E×B separator 214 from below, since both the forces due to the electric field and the magnetic field are exerted in the same direction, the beams 300 are bent obliquely upward, and separated from the trajectory of the multiple primary electron beams 20.

The multiple secondary electron beams 300 having been bent obliquely upward are further bent by the deflector 218, and projected onto the multi-detector 222 while being refracted by the electromagnetic lens 224. The multi-detector 222 detects the projected multiple secondary electron beams 300 having passed through the openings of the detector aperture array substrate 225. At the detection surface of the multi-detector 222, since each beam of the multiple primary electron beams 20 collides with a detection element corresponding to each secondary electron beam of the multiple secondary electron beams 300, electrons are amplified and generated, and secondary electron image data is generated for each pixel. An intensity signal detected by the multi-detector 222 is output to the detection circuit 106. A sub-irradiation region on the substrate 101, which is surrounded by the beam pitch in the x direction and the beam pitch in the y direction and in which the beam concerned itself is located, is irradiated with each primary electron beam, and the inside of the sub-irradiation region is scanned with each primary electron beam.

As described above, in order to acquire a secondary electron image, the substrate 101 is irradiated with the multiple primary electron beams 20, and the multi-detector 222 detects the multiple secondary electron beams 300 emitted from the substrate 101 due to the irradiation with the multiple primary electron beams 20. A reflected electron may be included in the detected multiple secondary electron beams 300. Alternatively, a reflected electron may be separated during moving in the secondary electron optical system 152 and therefore may not reach the multi-detector 222. Detected data (measured image data: secondary electron image data: inspection image data) on the secondary electron of each pixel in an individual irradiation region (sub-irradiation region) of each primary electron beam, detected by the multi-detector 222, is output to the detection circuit 106 in order of measurement. In the detection circuit 106, the detected data in analog form is converted into digital data by an A-D converter (not shown), and stored in the chip pattern memory 123. Then, acquired secondary electron image data (data of a secondary electron image 1) is transmitted to the comparison circuit 108, together with information on each position from the position circuit 107.

In order to acquire an image in the sub-irradiation region of each primary electron beam, a secondary electron beam corresponding to each primary electron beam needs to be detected by a corresponding detection element of the multi-detector 222. Therefore, in the system where the number of the multiple primary electron beams 20 and the number of detection elements of the multi-detector 222 are the same, it is important to perform alignment (positioning) between the multiple secondary electron beams 300 corresponding to the multiple primary electron beams 20 and a plurality of detection elements of the multi-detector 222.

Figure 3:
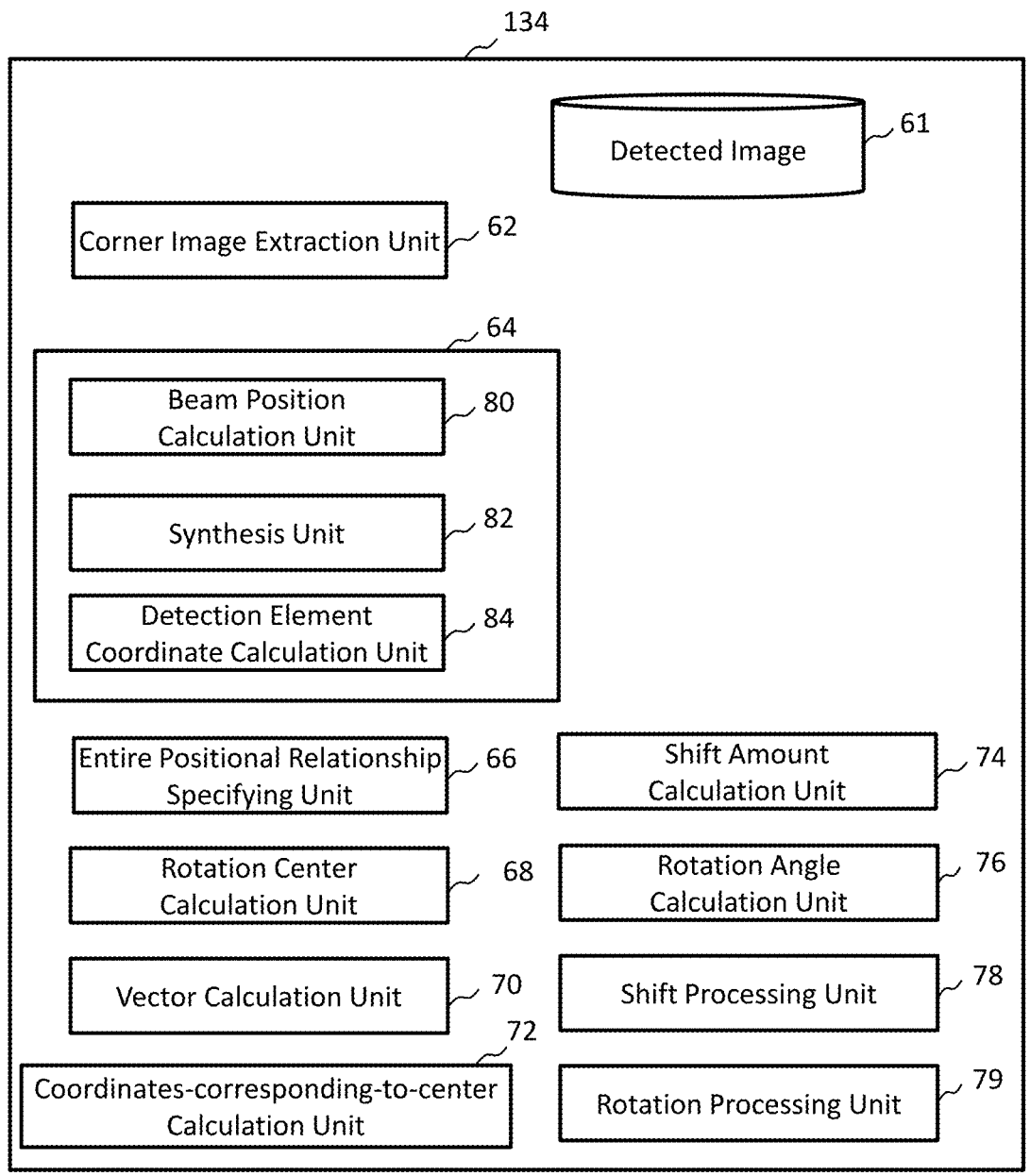
FIG. 3 is a block diagram showing an example of an internal configuration of an alignment circuit according to the first embodiment.

FIG. 3 is a block diagram showing an example of an internal configuration of an alignment circuit according to the first embodiment. As shown in FIG. 3, in the alignment circuit 134, there are arranged a storage device 61 such as a magnetic disk drive, a corner image extraction unit 62, a corner positional relationship calculation unit 64, an entire positional relationship specifying unit 66, a rotation center calculation unit 68, a vector calculation unit 70, a coordinates-corresponding-to-center calculation unit 72, a shift amount calculation unit 74, a rotation angle calculation unit 76, a shift processing unit 78, and a rotation processing unit 79.

Further, in the corner positional relationship calculation unit 64, there are arranged a beam position calculation unit 80, a synthesis unit 82, and a detection element coordinate calculation unit 84.

Each of the "units" such as the corner image extraction unit 62, the corner positional relationship calculation unit 64 (the beam position calculation unit 80, the synthesis unit 82, and the detection element coordinate calculation unit 84), the entire positional relationship specifying unit 66, the rotation center calculation unit 68, the vector calculation unit 70, the coordinates-corresponding-to-center calculation unit 72, the shift amount calculation unit 74, the rotation angle calculation unit 76, the shift processing unit 78, and the rotation processing unit 79 includes processing circuitry. The processing circuitry includes, for example, an electric circuit, a computer, a processor, a circuit board, a quantum circuit, a semiconductor device, or the like. Further, common processing circuitry (the same processing circuitry), or different processing circuitry (separate processing circuitry) may be used for each of the "units". Input data required in the corner image extraction unit 62, the corner positional relationship calculation unit 64 (the beam position calculation unit 80, the synthesis unit 82, and the detection element coordinate calculation unit 84), the entire positional relationship specifying unit 66, the rotation center calculation unit 68, the vector calculation unit 70, the coordinates-corresponding-to-center calculation unit 72, the shift amount calculation unit 74, the rotation angle calculation unit 76, the shift processing unit 78, and the rotation processing unit 79, and calculated results are stored in a memory (not shown) or in the memory 118 each time.

Figure 4:
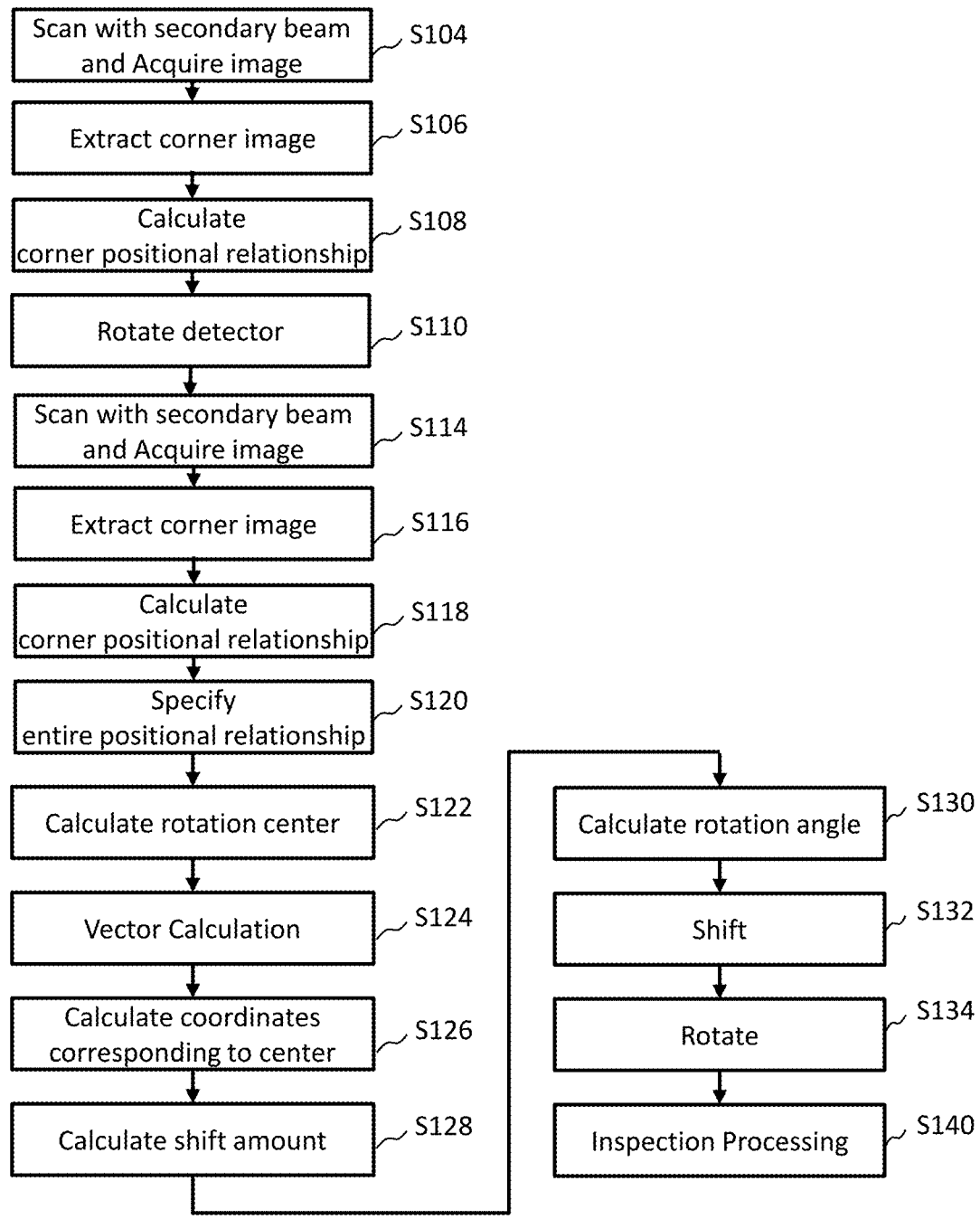
FIG. 4 is a flowchart showing an example of main steps of an inspection method according to the first embodiment.

FIG. 4 is a flowchart showing an example of main steps of an inspection method according to the first embodiment. In FIG. 4, the main steps of the inspection method of the first embodiment executes a series of steps: a secondary beam scan and image acquisition step (S104), a corner image extraction step (S106), a corner positional relationship calculation step (S108), a detector rotation step (S110), a secondary beam scanning and image acquisition step (S114), a corner image extraction step (S116), a corner positional relationship calculation step (S118), an entire positional relationship specifying step (S120), a rotation center calculation step (S122), a vector calculation step (S124), a coordinates-corresponding-to-center calculation step (S126), a shift amount calculation step (S128), a rotation angle calculation step (S130), a shift step (S132), a rotation step (S134), and an inspection processing step (S140).

A multiple electron beam alignment method according to the first embodiment executes the secondary beam scan and image acquisition step (S104), the corner image extraction step (S106), the corner positional relationship calculation step (S108), the detector rotation step (S110), the secondary beam scanning and image acquisition step (S114), the corner image extraction step (S116), the corner positional relationship calculation step (S118), the entire positional relationship specifying step (S120), the rotation center calculation step (S122), the vector calculation step (S124), the coordinates-corresponding-to-center calculation step (S126), the shift amount calculation step (S128), the rotation angle calculation step (S130), the shift step (S132), and the rotation step (S134). Whichever of the shift step (S132) and the rotation step (S134) may be performed first. Alternatively, they may be performed at the same time. Similarly, whichever of the shift amount calculation step (S128) and the rotation angle calculation step (S130) may be performed first. Alternatively, they may be performed at the same time.

Figure 5:
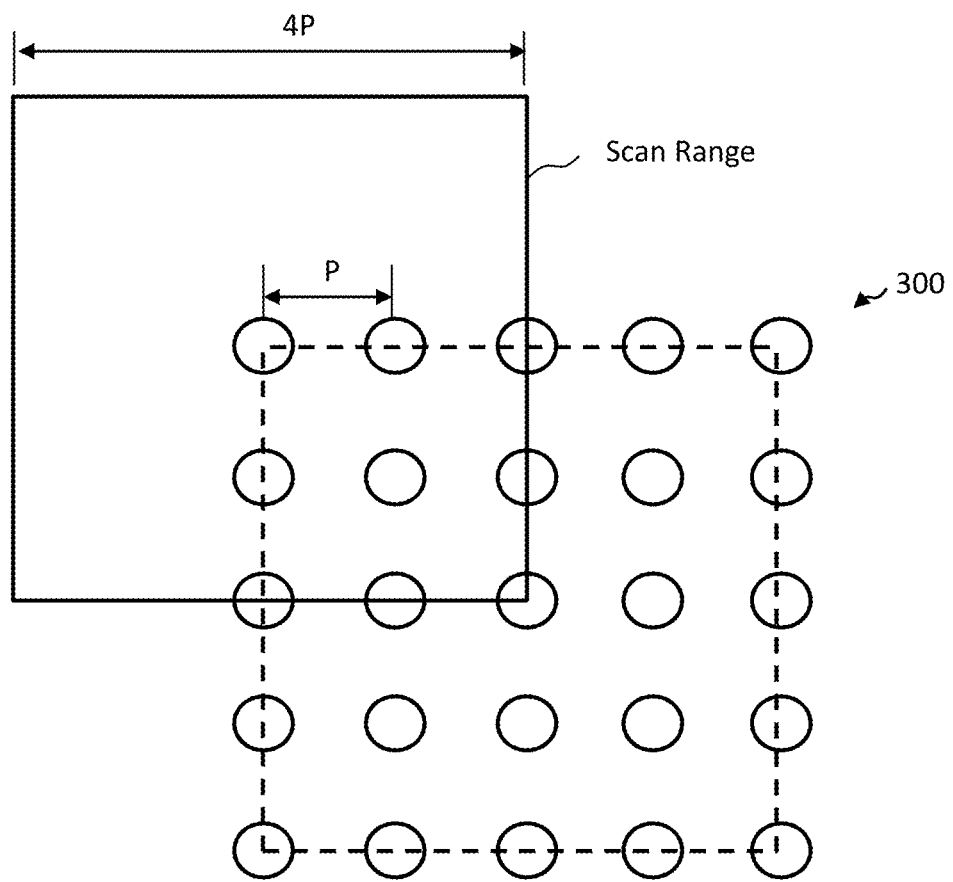
FIG. 5 is a diagram showing an example of a secondary electron beam array according to the first embodiment.

FIG. 5 is a diagram showing an example of a secondary electron beam array according to the first embodiment. FIG. 5 shows the case of the multiple secondary electron beams 300 of 5×5 beams, for example. Even when seeing an image (dotted line range) of beams close to the center beam shown in FIG. 5, it is difficult to distinguish (discriminate) a positional relationship concerning which beam in the image corresponds to which position. In contrast, according to an image of beams at the four corners, (e.g., 2×2 beams at the upper left corner), it is possible to distinguish a corner beam actually located at the corner among the beams. Therefore, the positional relationship concerning the beams can be obtained. When the positional relationship of beams with respect to an image is known, the positional relationship between detection elements having acquired the image and the beams can be obtained. Then, according to the first embodiment, using beams at the corner, an alignment between the multiple secondary electron beams 300 and a plurality of detection elements of the multi-detector 222 is performed. It is specifically described below.

In the secondary beam scan and image acquisition step (S104), the primary electron optical system 151 irradiates a target object surface on the XY stage 105 with the multiple primary electron beams 20. Specifically, it operates as follows: The image acquisition mechanism 150 applies the multiple primary electron beams 20 onto the stage 105 in a stopped state. At this time, the main deflector 208 and the sub deflector 209 align the center of the multiple primary electron beams 20 with the position of the trajectory central axis of the multiple primary electron beams. If, without being deflected, the center of the multiple primary electron beams 20 is located at the trajectory central axis of multiple primary electron beams, it is acceptable not to provide deflection. Thereby, the scanning center position of the scanning range of each primary electron beam is irradiated with each primary electron beam concerned. As the target object on the stage 105 serving as an irradiation position, a substrate for evaluation arranged on the stage 105 can be used, for example. Alternatively, the mark 111 or an upper surface of the stage 105 may be used.

The deflector 226 (deflector in a secondary electron optical system) scans a plurality of detection elements (first detection element) of the multi-detector 222 with the multiple secondary electron beams 300 emitted from the target object surface due to irradiation of the multiple primary electron beams 20. Specifically, it operates as follows: The multiple secondary electron beams 300 emitted from the target object surface are projected onto the multi-detector 222 by the secondary electron optical system 152 through the detector aperture array substrate 225. In this state, the deflector 226 scans the secondary beam scanning range which has been set in advance for the multiple secondary electron beams 300. The multi-detector 222 detects the multiple secondary electron beams 300 by a plurality of detection elements (first detection element) arrayed in a grid. Thereby, each detection element acquires an aperture image of the detector aperture array substrate 225. The multi-detector 222 detects a plurality of beams including at least a corner beam located at a corner among the multiple secondary electron beams 300.

When the deflector 226 collectively performs scanning with the multiple secondary electron beams 300, it scans the scanning range being four or more times the beam pitch P of the multiple secondary electron beams 300 as shown in FIG. 5. FIG. 5 shows a scanning range, by a solid line, being four times the beam pitch P of the multiple secondary electron beams 300. Thereby, when performing scanning with the multiple secondary electron beams 300, 2×2 beams including a corner beam can be contained in the scan range of each of 2×2 detection elements corresponding to the 2×2 beams including the corner beam.

Figure 6:
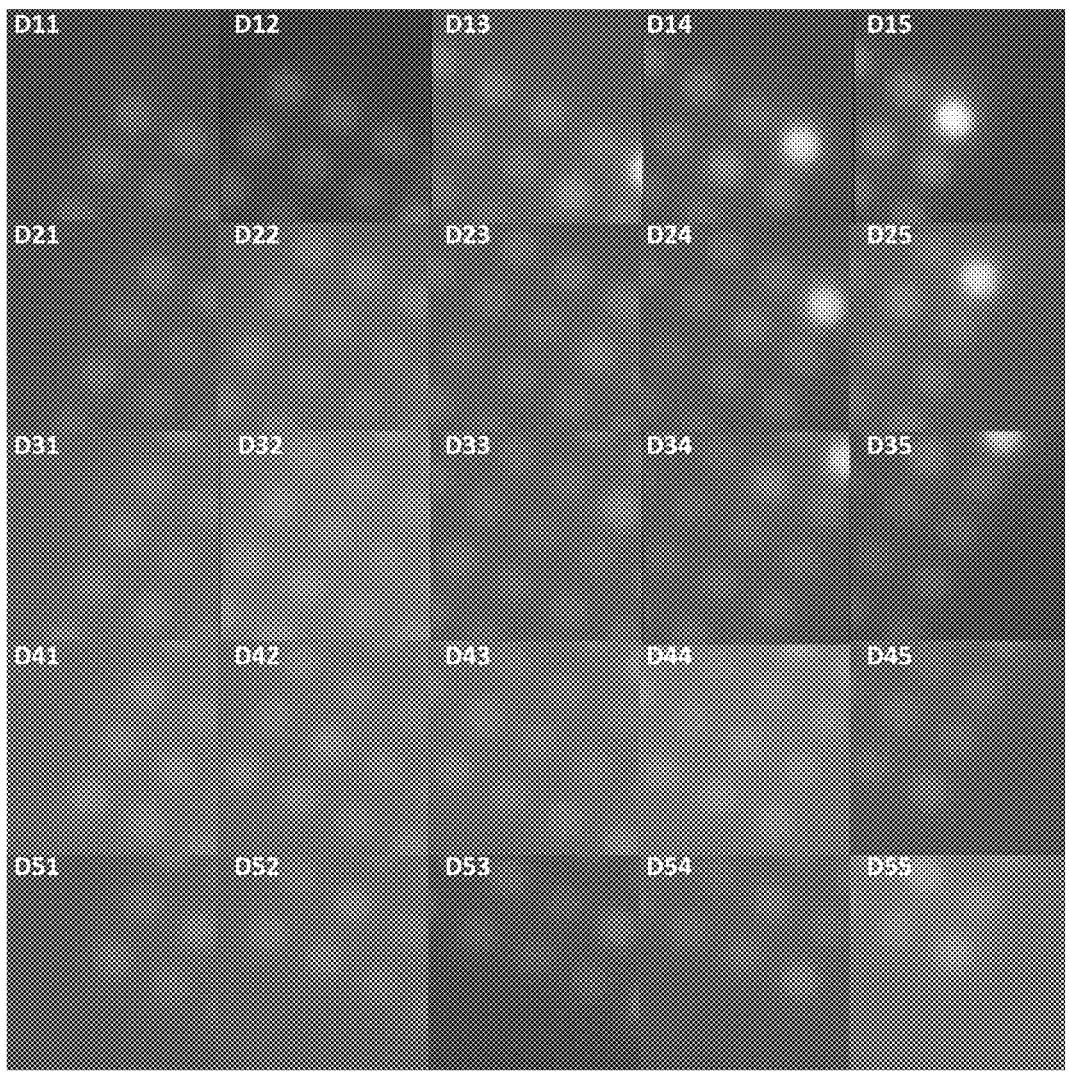
FIG. 6 is a figure showing examples of images each obtained by each detection element according to the first embodiment.

FIG. 6 is a figure showing examples of images each obtained by each detection element according to the first embodiment. FIG. 6 shows examples of aperture images imaged by 5×5 detection elements D11 to D55 corresponding to the multiple secondary electron beams 300 of 5×5 beams. Each detection element acquires images of a plurality of secondary electron beams passing over the detection element concerned due to a scanning operation of the multiple secondary electron beams 300. Actually, beams having passed through the openings in the detector aperture array substrate 225 are detected. Therefore, a plurality of aperture images are detected by each detection element. Detection data on a secondary electron detected by each detection element is output to the detector 106 in order of measurement. In the detection circuit 106, the detection data in analog form is converted into digital data by an A-D converter (not shown), and stored in the chip pattern memory 123. Then, the obtained secondary electron image data is output to the alignment circuit 134. In the alignment circuit 134, the secondary electron image data (detected image) is stored in the storage device 61.

In the corner image extraction step (S106), the corner image extraction unit 62 extracts corner images from images of all the detection elements.

Figure 7:
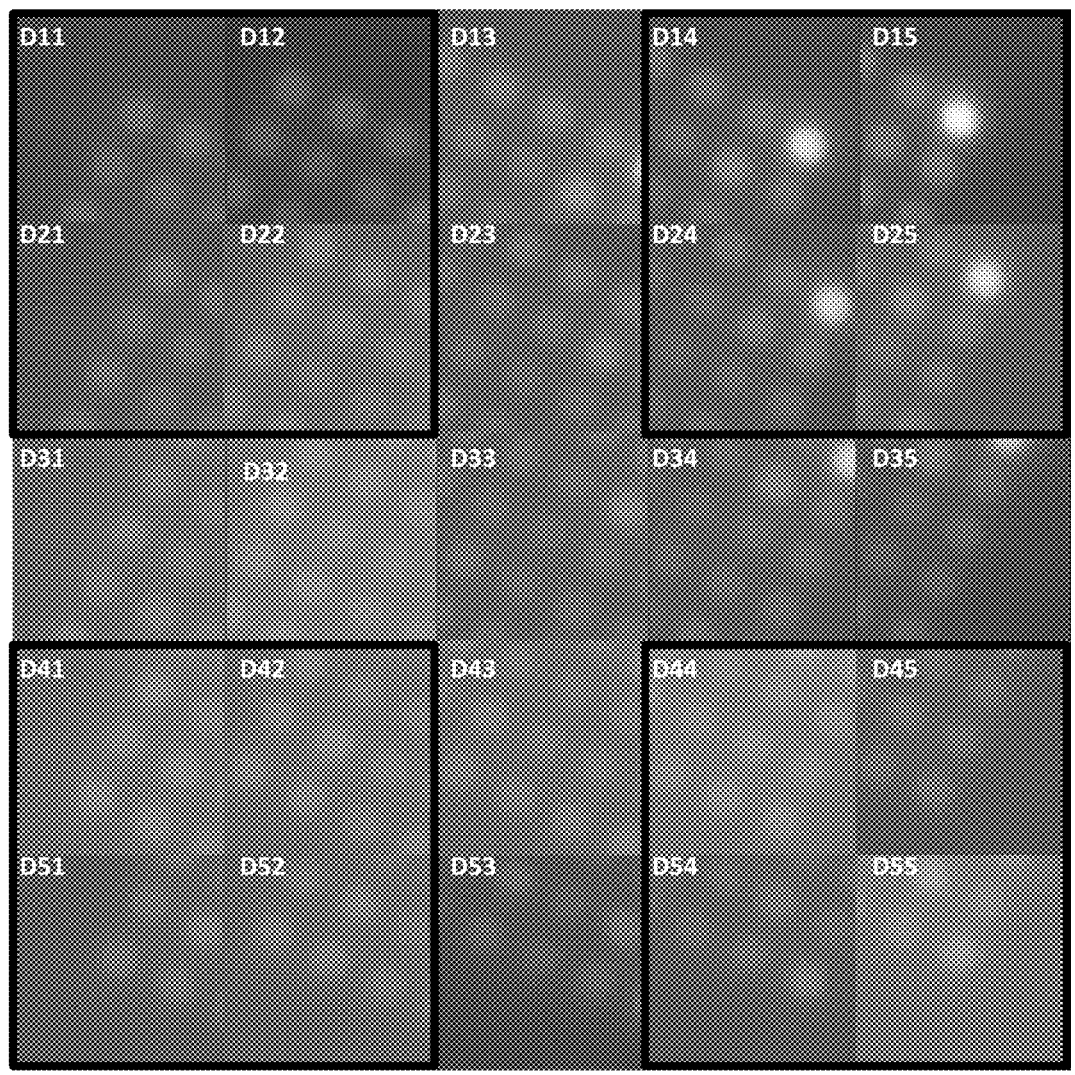
FIG. 7 is a figure showing corner images among examples of images imaged by each detection element according to the first embodiment.

FIG. 7 is a figure showing corner images among examples of images imaged by each detection element according to the first embodiment. FIG. 7 shows, similarly to FIG. 6, images imaged by the 5×5 detection elements D11 to D55. In FIG. 7, images acquired by 2×2 detection elements D11, D12, D21, and D22, including one of corner images which is imaged by the detection element D11, are shown. Similarly, images acquired by 2×2 detection elements D14, D15, D24, and D25, including one of corner images which is imaged by the detection element D15, are shown. Similarly, images acquired by 2×2 detection elements D41, D42, D51, and D52, including one of corner images which is imaged by the detection element D51, are shown. Similarly, images acquired by 2×2 detection elements D44, D45, D54, and D55, including one of corner images which is imaged by the detection element D55, are shown.

The 2×2 detection elements D11, D12, D21, and D22, including the detection element D11, detect aperture images of 2×2 adjacent secondary electron beams including a corner beam corresponding to the detection element D11. Similarly, the 2×2 detection elements D14, D15, D24, and D25, including the detection element D15, detect aperture images of 2×2 adjacent secondary electron beams including a corner beam corresponding to the detection element D15. Similarly, the 2×2 detection elements D41, D42, D51, and D52, including the detection element D51, detect aperture images of 2×2 adjacent secondary electron beams including a corner beam corresponding to the detection element D15. Similarly, the 2×2 detection elements D44, D45, D54, and D55, including the detection element D55, detect aperture images of 2×2 adjacent secondary electron beams including a corner beam corresponding to the detection element D55.

Now, images acquired by the 2×2 detection elements D11, D12, D21, and D22 are extracted, for example.

There may be a case where no corner beam exists in images. As a cause of this, the beam pitch of the multiple secondary electron beams 300 may be too wide. In that case, the beam pitch should be adjusted, and it restarts again from the secondary beam scan and image acquisition step (S104).

Further, there may be a case where images of two or more corners cannot be obtained with respect to four corners. As a cause of this, the beam axis of the multiple secondary electron beams 300 may largely deviate. In that case, the beam axis should be adjusted, and it restarts again from the secondary beam scan and image acquisition step (S104).

In the corner positional relationship calculation step (S108), the corner positional relationship calculation unit 64 (positional relationship calculation unit) calculates a positional relationship between a plurality of beams including a corner beam and a plurality of detection elements (second detection element) having detected the plurality of beams including the corner beam in a plurality of detection elements. Specifically, it operates as follows:

The beam position calculation unit 80 calculates, for each extracted image, the position of 2×2 beams including a corner beam. If an image of 2×2 beams including a corner beam can be obtained, it is possible to distinguish a corner beam based on the positional relationship. Thus, for example, it is possible to determine the beam to be a corner beam if no adjacent beam exists in a predetermined range in the direction (e.g., −x direction) opposite to the direction (x direction) where an adjacent beam exists, and, with respect to the direction perpendicular to the above direction, no adjacent beam exists in a predetermined range in the direction (e.g., y direction) opposite to the direction (−y direction) where another adjacent beam exists.

Figure 8:
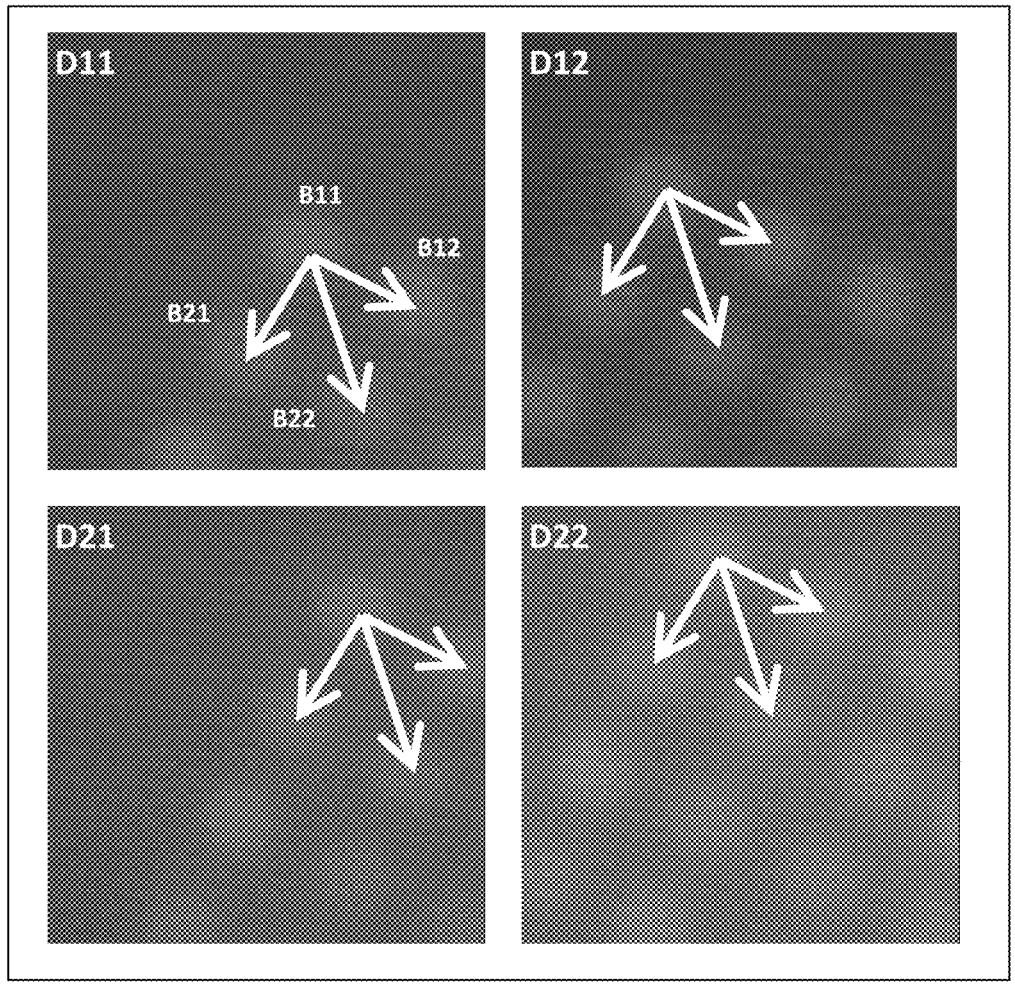
FIG. 8 is a figure showing an example of images at a corner according to the first embodiment.

FIG. 8 is a figure showing an example of images at a corner according to the first embodiment. The example of FIG. 8 shows images of 2×2 detection elements D11, D12, D21, and D22. For example, the image acquired by the detection element D11 is an image centering on the position of the scanning center (center of scanning range) of the beam B11 which is corresponding to the detection element D11. Then, by the method described above, the corner beam B11 can be distinguished. If the corner beam B11 is known, the relative position of the actually imaged corner beam B11 to the position of the scanning center of the corner beam B11 can be calculated. Further, if the corner beam B11 is known, the adjacent beams B12, B21, and B22 can be distinguished based on the positional relationship of the multiple secondary electron beams 300. Therefore, the relative position of each of the beams B12, B21, and B22 from the scan center position of the corner beam B11 (or from the corner beam B11) can be calculated. The same applies to each image of the other remaining detection elements D12, D21, and D22. Thereby, the position of each of the beams B11, B12, B21, and B22 from the scan center position (each image center) of the beam concerned can be calculated for each image.

Figure 9:
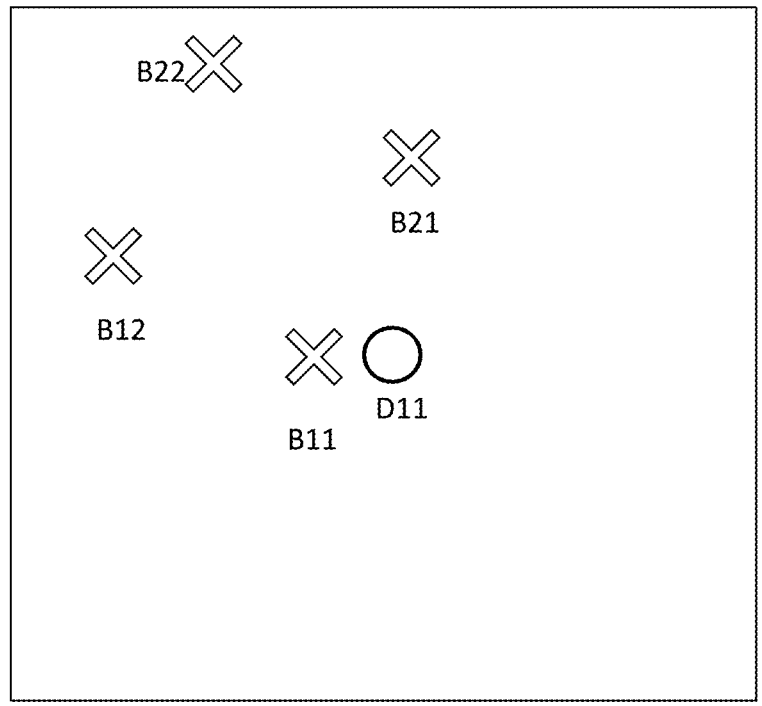
FIG. 9 is an illustration showing a relation between the position of the detection element D11 and that of each of the beams B11, B12, B21, and B22 according to the first embodiment.

FIG. 9 is an illustration showing a relation between the position of the detection element D11 and that of each of the beams B11, B12, B21, and B22 according to the first embodiment. FIG. 9 shows positions of respective beams B11, B12, B21, and B22 calculated from an image centering on the position of the detection element D11. If alignment has been performed between the multiple secondary electron beams 300 and respective corresponding detection elements, the position of the scanning center of each beam and the position of a corresponding detection element are coincident. Therefore, when each of the beams B11, B12, B21, and B22 detected in a detection image is centering on the detection element D11, they exist at the positions each obtained by reversing (upside down and right side left) a vector of each beam from the detection image center. Therefore, as shown in FIG. 9, in the case of centering on the detection element D11, the corner beam B11 exists at the position located in the direction opposite to the vector from the detection image center to the corner beam B11 and away from the detection element D11 by the same vector length. Similarly, the beam B12 exists at the position located in the direction opposite to the vector from the detection image center to the beam B12 and away from the detection element D11 by the same vector length. Similarly, the beam B21 exists at the position located in the direction opposite to the vector from the detection image center to the beam B21 and away from the detection element D11 by the same vector length. Similarly, the beam B22 exists at the position located in the direction opposite to the vector from the detection image center to the beam B22 and away from the detection element D11 by the same vector length.

Figure 10:
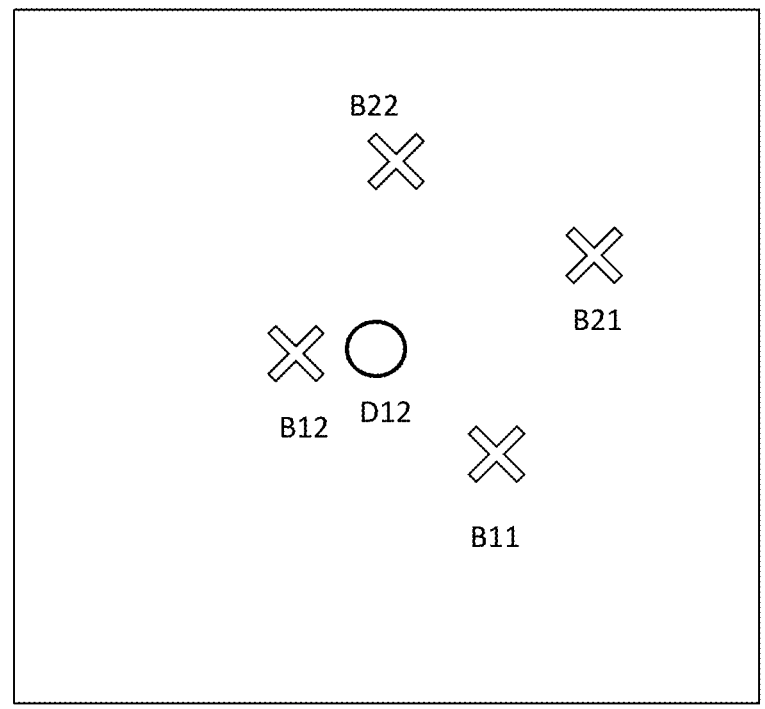
FIG. 10 is an illustration showing a relation between the position of the detection element D12 and that of each of the beams B11, B12, B21, and B22 according to the first embodiment.

FIG. 10 is an illustration showing a relation between the position of the detection element D12 and that of each of the beams B11, B12, B21, and B22 according to the first embodiment. FIG. 10 shows positions of respective beams B11, B12, B21, and B22 calculated from an image centering on the position of the detection element D12. Similarly to FIG. 9, in the case of centering on the detection element D12, the corner beam B11 exists at the position located in the direction opposite to the vector from the detection image center to the corner beam B11 and located away from the detection element D12 by the same vector length. Similarly, the beam B12 exists at the position located in the direction opposite to the vector from the detection image center to the beam B12 and away from the detection element D12 by the same vector length. Similarly, the beam B21 exists at the position located in the direction opposite to the vector from the detection image center to the beam B21 and away from the detection element D12 by the same vector length. Similarly, the beam B22 exists at the position located in the direction opposite to the vector from the detection image center to the beam B22 and away from the detection element D12 by the same vector length.

Figure 11:
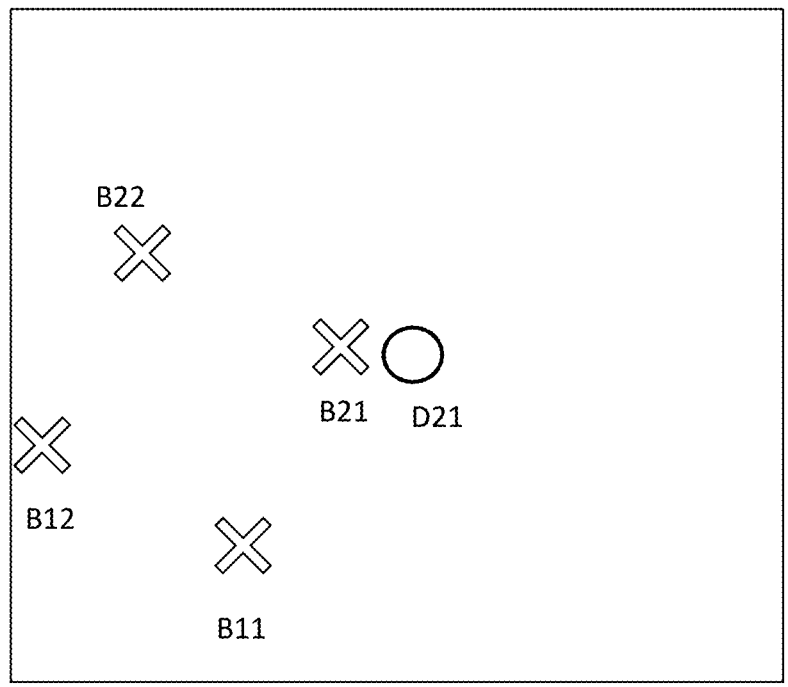
FIG. 11 is an illustration showing a relation between the position of the detection element D21 and that of each of the beams B11, B12, B21, and B22 according to the first embodiment.

FIG. 11 is an illustration showing a relation between the position of the detection element D21 and that of each of the beams B11, B12, B21, and B22 according to the first embodiment. FIG. 11 shows positions of respective beams B11, B12, B21, and B22 calculated from an image centering on the position of the detection element D21. Similarly to FIG. 9, in the case of centering on the detection element D21, the corner beam B11 exists at the position located in the direction opposite to the vector from the detection image center to the corner beam B11 and away from the detection element D21 by the same vector length. Similarly, the beam B12 exists at the position located in the direction opposite to the vector from the detection image center to the beam B12 and away from the detection element D21 by the same vector length. Similarly, the beam B21 exists at the position located in the direction opposite to the vector from the detection image center to the beam B21 and away from the detection element D21 by the same vector length. Similarly, the beam B22 exists at the position located in the direction opposite to the vector from the detection image center to the beam B22 and away from the detection element D21 by the same vector length.

Figure 12:
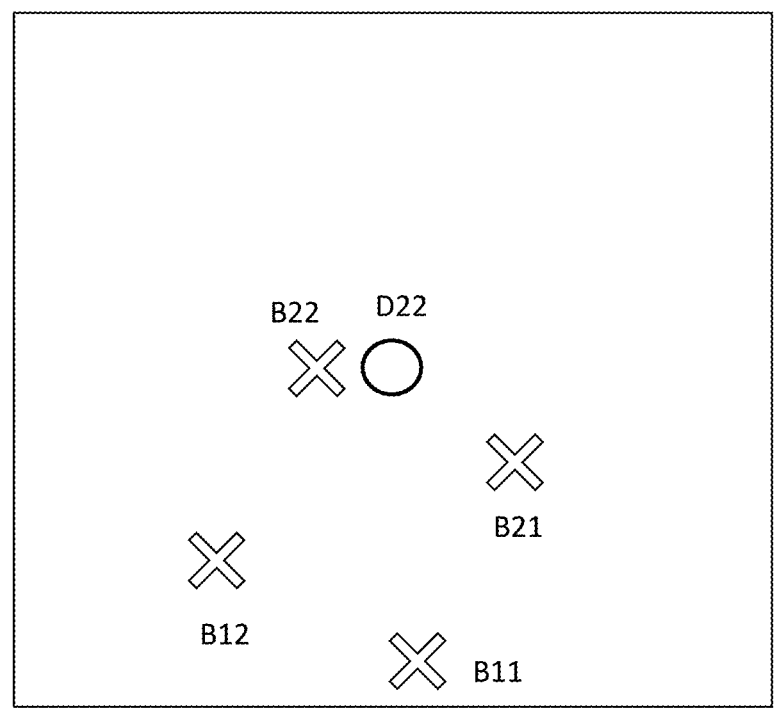
FIG. 12 is an illustration showing a relation between the position of the detection element D22 and that of each of the beams B11, B12, B21, and B22 according to the first embodiment.

FIG. 12 is an illustration showing a relation between the position of the detection element D22 and that of each of the beams B11, B12, B21, and B22 according to the first embodiment. FIG. 12 shows positions of respective beams B11, B12, B21, and B22 calculated from an image centering on the position of the detection element D22. Similarly to FIG. 9, in the case of centering on the detection element D22, the corner beam B11 exists at the position located in the direction opposite to the vector from the detection image center to the corner beam B11 and away from the detection element D22 by the same vector length. Similarly, the beam B12 exists at the position located in the direction opposite to the vector from the detection image center to the beam B12 and away from the detection element D22 by the same vector length. Similarly, the beam B21 exists at the position located in the direction opposite to the vector from the detection image center to the beam B21 and away from the detection element D22 by the same vector length. Similarly, the beam B22 exists at the position located in the direction opposite to the vector from the detection image center to the beam B22 and away from the detection element D22 by the same vector length.

Next, the synthesis unit 82 synthesizes the positional relation between respective detection elements and the respective beam positions calculated from the four images at the corner.

Figure 13:
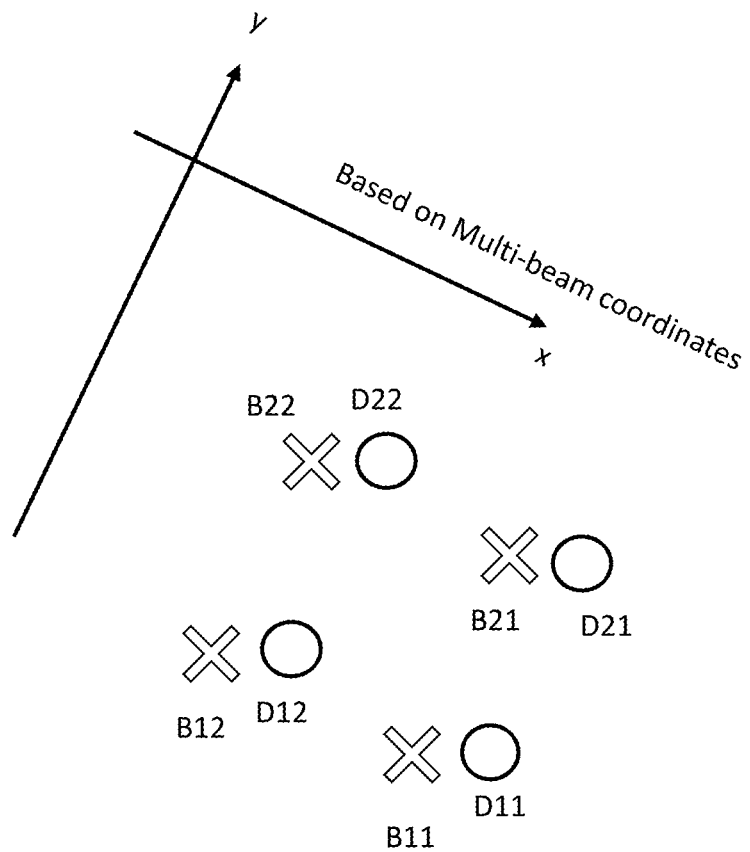
FIG. 13 is an illustration showing an example of a relation after synthesis between the position of each detection element and that of each beam according to the first embodiment.

FIG. 13 is an illustration showing an example of a relation after synthesis between the position of each detection element and that of each beam according to the first embodiment. The same 2×2 beams B11, B12, B21, and B22 are used in every positional relationship. Therefore, the positional relationship among the 2×2 beams B11, B12, B21, and B22 is the same. Then, the positions of respective detection elements are synthesized so that the positions of the same beams for each of the 2×2 beams B11, B12, B21, and B22 including the corner beam B11 may be aligned between the images. FIG. 13 shows, based on coordinates of the multiple secondary electron beams 300 (which is a secondary coordinate system), a relation between the position of each of the detection elements D11, D12, D21, and D22 and that of each of the beams B11, B12, B21, and B22 at a corner. The secondary coordinate system is a coordinate system centering on the center position of the multiple secondary electron beams 300. Therefore, coordinates of each secondary electron beam of the multiple secondary electron beams 300 can be specified in the secondary coordinate system. Accordingly, if the positional relationship with each beam is known, coordinates of the detection element in the secondary coordinate system can be specified.

Further, the positional relationship is similarly calculated with respect to other corners. Specifically, the relation between the position of each of the detection elements D14, D15, D24, and D25 and that of each of the beams B14, B15, B24, and B25 is calculated. Similarly, the relation between the position of each of the detection elements D41, D42, D51, and D52 and that of each of the beams B41, B42, B51 and B52 is calculated. Similarly, the relation between the position of each of the detection elements D44, D45, D54, and D55 and that of each of the beams B44, B45, B54, and B55 is calculated.

In the detector rotation step (S110), the detector stage control circuit 130 controls the drive mechanism 132 to rotate the rotary stage 227. Thereby, the rotary stage 227 rotates the multi-detector 222 by a preset rotation angle φ (first rotation angle).

In the secondary beam scanning and image acquisition step (S114), the image acquisition mechanism 150 applies the multiple primary electron beams 20 onto the stage 105 in a stopped state. At this time, the main deflector 208 and the sub deflector 209 align the center of the multiple primary electron beams 20 with the position of the trajectory central axis of the multiple primary electron beams.

Then, the deflector 226 (deflector in the secondary electron optical system) scans a plurality of detection elements (first detection element) of the multi-detector 222 having been rotated, with the multiple secondary electron beams 300 emitted from the target object surface. Then, the multi-detector 222 in the state of having been rotated detects the multiple secondary electron beams 300 by a plurality of detection elements (first detection element) arrayed in a grid. Thereby, each detection element acquires an aperture image of the detector aperture array substrate 225. In other words, the multi-detector 222 detects a plurality of beams including a corner beam. The method of scanning is the same as that of the secondary beam scan and image acquisition step (S104).

In the corner image extraction step (S106), the corner image extraction unit 62 extracts corner images from images of all the detected detection elements of the multi-detector 222 which is in a state of having been rotated. The method of extraction is the same as that of the corner image extraction step (S106).

In the corner positional relationship calculation step (S118), the corner positional relationship calculation unit 64 calculates a positional relationship between a plurality of beams including a corner beam and a plurality of detection elements (second detection element) of the multi-detector 222 after rotated which have detected the plurality of beams including the corner beam. The contents of the corner positional relationship calculation step (S118) are the same as those of the corner positional relationship calculation step (S108).

As described above, the relation is calculated between the position of each of the beams B11, B12, B21, and B22 and that of each of the detection elements D11, D12, D21, and D22 of the multi-detector 222 being in a state after rotation. Similarly, the relation is calculated between the position of each of the beams B14, B15, B24 and B25 and that of each of the detection elements D14, D15, D24, and D25 in the second coordinate system at the time of the multi-detector 222 being in a state after rotation. Similarly, the relation is calculated between the position of each of the beams B41, B42, B51 and B52 and that of each of the detection elements D41, D42, D51, and D52 of the multi-detector 222 being in a state after rotation. Similarly, the relation is calculated between the position of each of the beams B44, B45, B54, and B55 and that of each of the detection elements D44, D45, D54, and D55 of the multi-detector 222 being in a state after rotation.

In the entire positional relationship specifying step (S120), the entire positional relationship specifying unit 66 specifies an entire positional relationship between the multiple secondary electron beams 300 and the entire detection elements.

Figure 14:
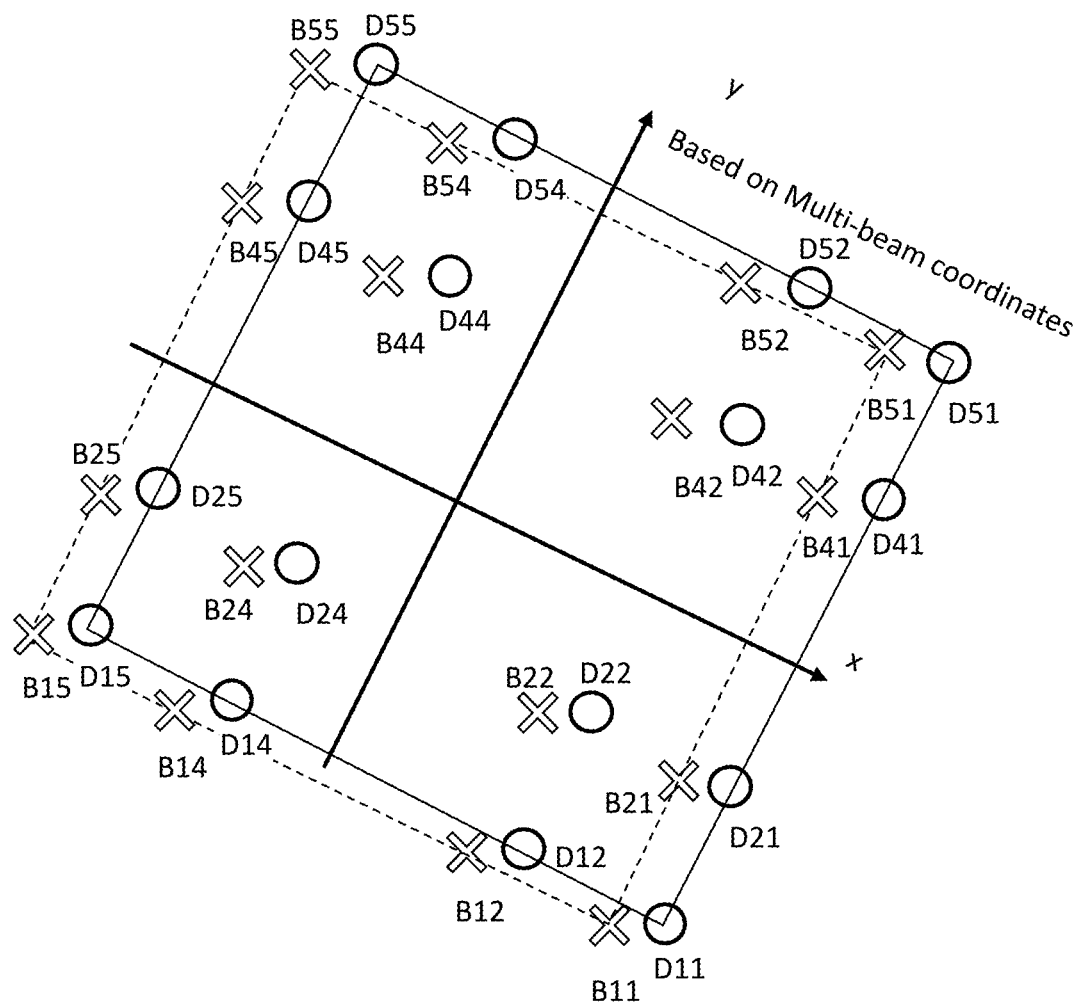
FIG. 14 is an illustration showing an example of an entire positional relationship according to the first embodiment.

FIG. 14 is an illustration showing an example of an entire positional relationship according to the first embodiment. Since positional relationships at four corners have been calculated, the relationships are combined. Further, since the arrangement positional relationship and the arrangement pitch of the 5×5 detection elements D11 to D55 of the multi-detector 222 are known in advance, with defining 2×2 detection elements calculated at each corner as one set, four sets for four corners are individually applied to a corresponding arrangement position. Thereby, as shown in FIG. 14, the position of the whole of the 5×5 multiple secondary electron beams 300 with respect to the position of the whole of the 5×5 detection elements can be specified. Therefore, it is possible to specify a positional relationship among the 5×5 detection elements D11 to D55 in the secondary coordinate system.

Figure 15:
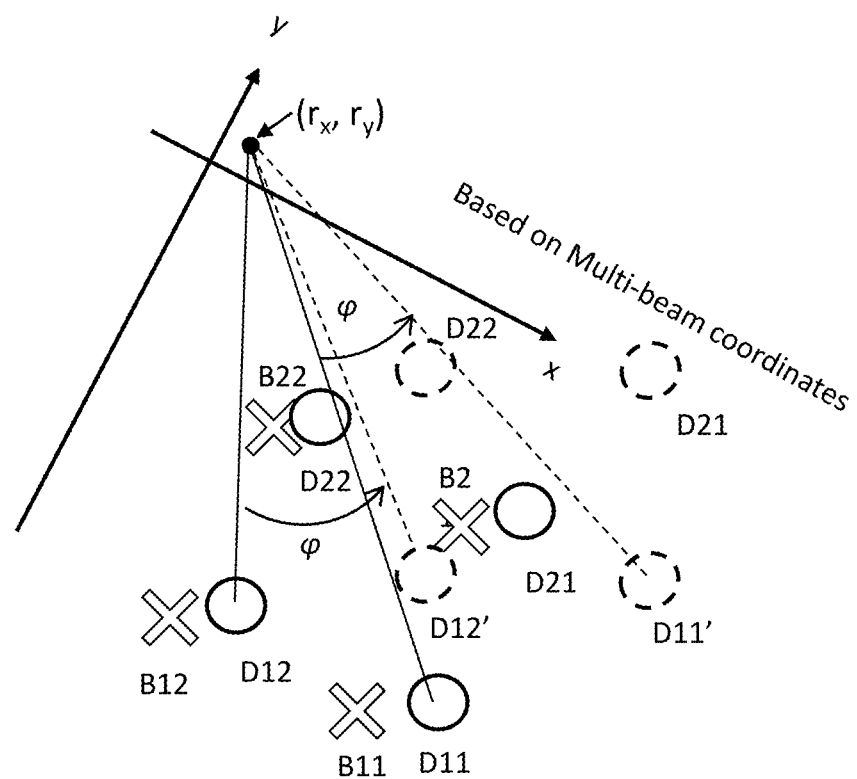
FIG. 15 is an illustration showing examples of coordinates of a plurality of detection elements of a multi-detector before and after rotation according to the first embodiment.

FIG. 15 is an illustration showing examples of coordinates of a plurality of detection elements of a multi-detector before and after rotated according to the first embodiment. As shown in FIG. 15, while rotating on unknown rotation center coordinates ($r_x$, $r_y$) as a rotation axis, the detection element D11 (D11') moves from the coordinates (x1, y1) (before rotation) to the coordinates (X1, Y1) (after rotation). Similarly, while rotating on unknown rotation center coordinates ($r_x$, $r_y$) as a rotation axis, the detection element D12 (D12') moves from the coordinates (x2, y2) (before rotation) to the coordinates (X2, Y2) (after rotation).

In the rotation center calculation step (S122), the rotation center calculation unit 68 calculates rotation center coordinates of the multi-detector 222, based on a rotation angle φ (first rotation angle) by which the multi-detector 222 has been rotated, and a positional relationship between a plurality of beams including a corner beam and a plurality of detection elements before and after rotated. Specifically, as described above, the positional relationship between 2×2 beams including a corner beam and 2×2 detection elements before rotated which are corresponding to the 2×2 beams has already been calculated. Then, based on this positional relationship, the detection element coordinate calculation unit 84 calculates coordinates of each of the detection elements D11, D12, D21, and D22 in the secondary coordinate system. Since the coordinates of each secondary electron beam are definable by the secondary coordinate system, coordinates of each of the detection elements D11, D12, D21, and D22 can be calculated. Similarly, the positional relationship between 2×2 beams including a corner beam and 2×2 detection elements after rotated which are corresponding to the 2×2 beams has already been calculated. The position of the multiple secondary electron beams 300 in the secondary coordinate system does not change before and after rotation of the multi-detector 222. Therefore, based on the positional relationship of the multi-detector 222 having been rotated, the detection element coordinate calculation unit 84 calculates coordinates of each of the detection elements D11, D12, D21, and D22 in the secondary coordinate system at the time of the multi-detector 222 being in a state after rotation. Positions of two or more detection elements before and after rotated in the 2×2 detection elements before and after rotated are used. Here, the rotation center coordinates ($r_x$, $r_y$) of the multi-detector 222 are calculated using, for example, the rotation angle φ by which the multi-detector 222 has been rotated, and coordinates (x1, y1), (x2, y2), (X1, Y1), and (X2, Y2) of two detected detection elements D11 (D11') and D12 (D12') before and after rotated.

FIG. 16 is an equation for calculating rotation center coordinates according to the first embodiment. Based on a relation of coordinates before and after rotation, it is possible to obtain rotation center coordinates ($r_x$, $r_y$) by the equation (1). In the equation (1), coordinates of n points of detection elements before and after rotation such as coordinates (x1, y1), (x2, y2), . . . , (xn, yn), and (X1, Y1), (X2, Y2), . . . , (Xn, Yn) are used, where n should be 2 or more. Further, in FIG. 16, a detection element is denoted by PD. Coordinates of 2×2 detection elements are known for each corner. Therefore, the accuracy of calculation can be increased by using coordinates of four points of detection elements before and after rotation compared to using coordinates of two points of detection elements before and after rotation. Moreover, coordinates of 2×2 detection elements at the other remaining three corners in the secondary coordinate system can be similarly calculated based on an individual positional relationship. Alternatively, coordinates of 2×2 detection elements at the other remaining three corners in the secondary coordinate system can be calculated based on an entire positional relationship. Therefore, coordinates of sixteen points of detection elements before and after rotation at four corners can be obtained. The accuracy of calculation can be further increased by using coordinates of sixteen points of detection elements before and after rotation compared to using coordinates of four points of detection elements before and after rotation.

The examples described above explain operations in the case where a relative rotation center position to a plurality of detection elements D11 to D55 of the multi-detector 222 disposed on the detector stage 229 is not known. If the relative rotation center position to the plurality of detection elements D11 to D55 is known in advance, the detector rotation step (S110), the secondary beam scanning and image acquisition step (S114), the corner image extraction step (S116), and the corner positional relationship calculation step (S118) may be omitted. In such a case of omission, coordinates of the rotation center coordinate C1 can be calculated, in the rotation center calculation step (S122), based on a relative positional relationship between at least one of the coordinates of the plurality of detection elements D11 to D55 which has already been obtained and the rotation center position.

In the vector calculation step (S124), with respect to 2×2 detection elements at a corner, the vector calculation unit 70 decomposes the vector from the coordinates of the detection element which is actually at the corner to the rotation center coordinates C1 ($r_x$, $r_y$) into two vectors from the coordinates of the detection element actually at the corner to the coordinates of other remaining two detection elements at the outer peripheral side.

Figure 17:
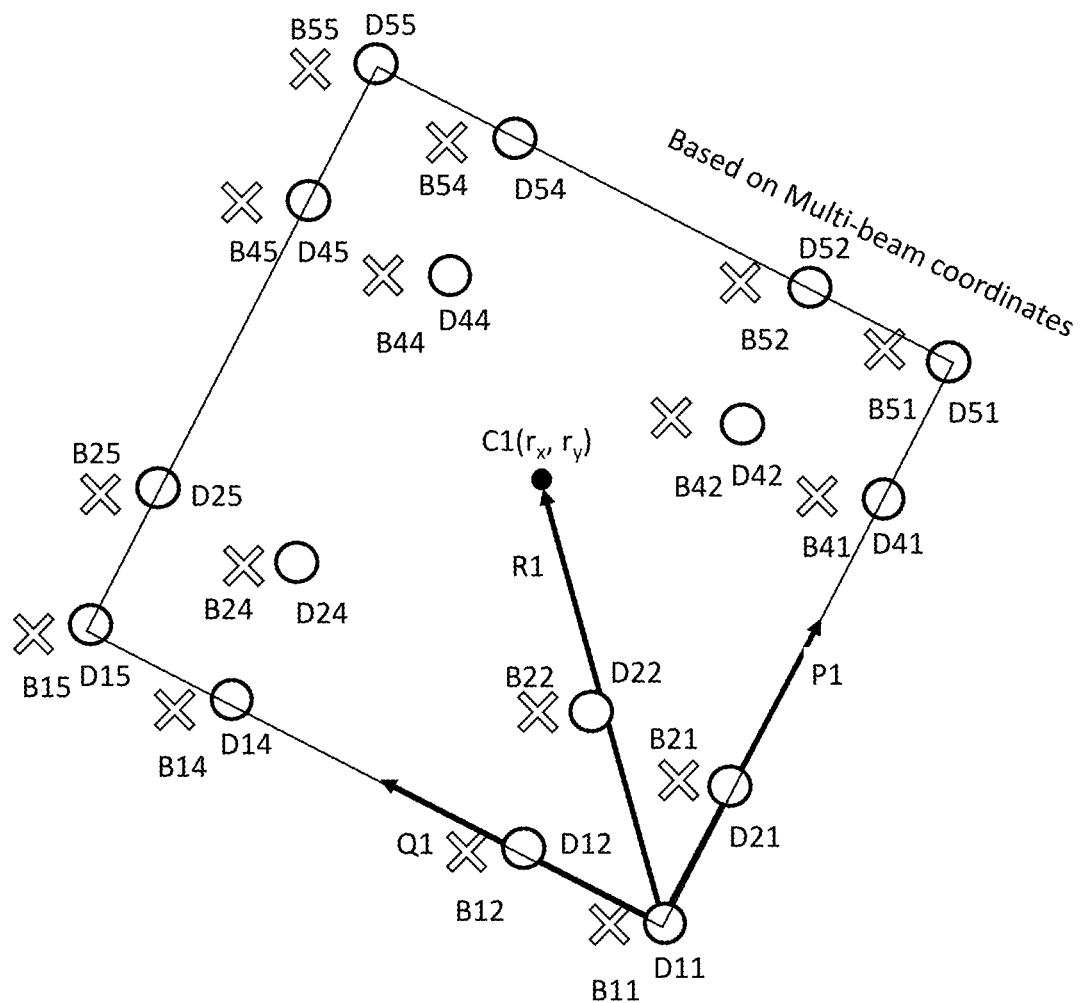
FIG. 17 is an illustration describing a vector calculation method for coordinates of a detection element according to the first embodiment.

FIG. 17 is an illustration describing a vector calculation method for coordinates of a detection element according to the first embodiment. With respect to the detection element D11 actually at the corner before rotation and the two detection elements D12 and D21 at the rotation outer peripheral side before rotation, the vector calculation unit 70 decomposes a vector R1 from the coordinates (x1, y1) of the detection element D11 to the rotation center coordinates ($r_x$, $r_y$) into two vectors of a vector Q1 from the coordinates (x1, y1) of the detection element D11 to the coordinates (x2, y2) of the detection element D12, and a vector P1 from the coordinates (x1, y1) of the detection element D11 to the coordinates (x3, y3) of the detection element D21. The vector R1 can be defined by the following equation (2) using the vectors P1 and Q1. The sign (-) which denotes a vector is omitted in the equation (2).

$$R1 = \alpha P1 + \beta Q1 \qquad (2)$$

FIG. 18 is an equation for calculating a vector coefficient according to the first embodiment. Unknown vector coefficients α and β can be obtained by the equation (3). In the equation (3), let the vector P1=($P_x$, $P_y$), the vector Q1=($Q_x$, $Q_y$), and the vector R1=($R_x$, $R_y$).

Although, in the above examples, the case of using the detection element D11 as a detection element being a basic point is described, it is not limited thereto. Any of the four detection elements D11, D15, D51, and D55, each of which is actually at any one of the four corners, can be used for the calculation. Thus, by using one of the four detection elements D11, D15, D51, and D55 each of which is actually at any one of four corners, vector calculation can be performed using positions of the 2×2 detection elements located at one corner and its vicinity. Alternatively, it is also preferable to use an entire positional relationship as shown in FIG. 17. In the case of using an entire positional relationship, a detection element other than the detection elements D11, D15, D51, and D55 actually at the corner may be used as a basic point. For example, the detection element D22 can be used. In that case, for example, the vector calculation can be performed by using the positions of the two detection elements D42 and D24. Since the entire positional relationship in the secondary coordinate system has already been obtained, the coordinates of each detection element can be calculated based on the secondary coordinate system.

In the coordinates-corresponding-to-center calculation step (S126), the coordinates-corresponding-to-center calculation unit 72 calculates corresponding coordinates C2 with respect to the multiple secondary electron beams B11, B21, and B12, whose positional relationship is the same as that of the rotation center coordinates $(r_x, r_y)$ with respect to the plurality of detection elements D11, D21, and D12.

Figure 19:
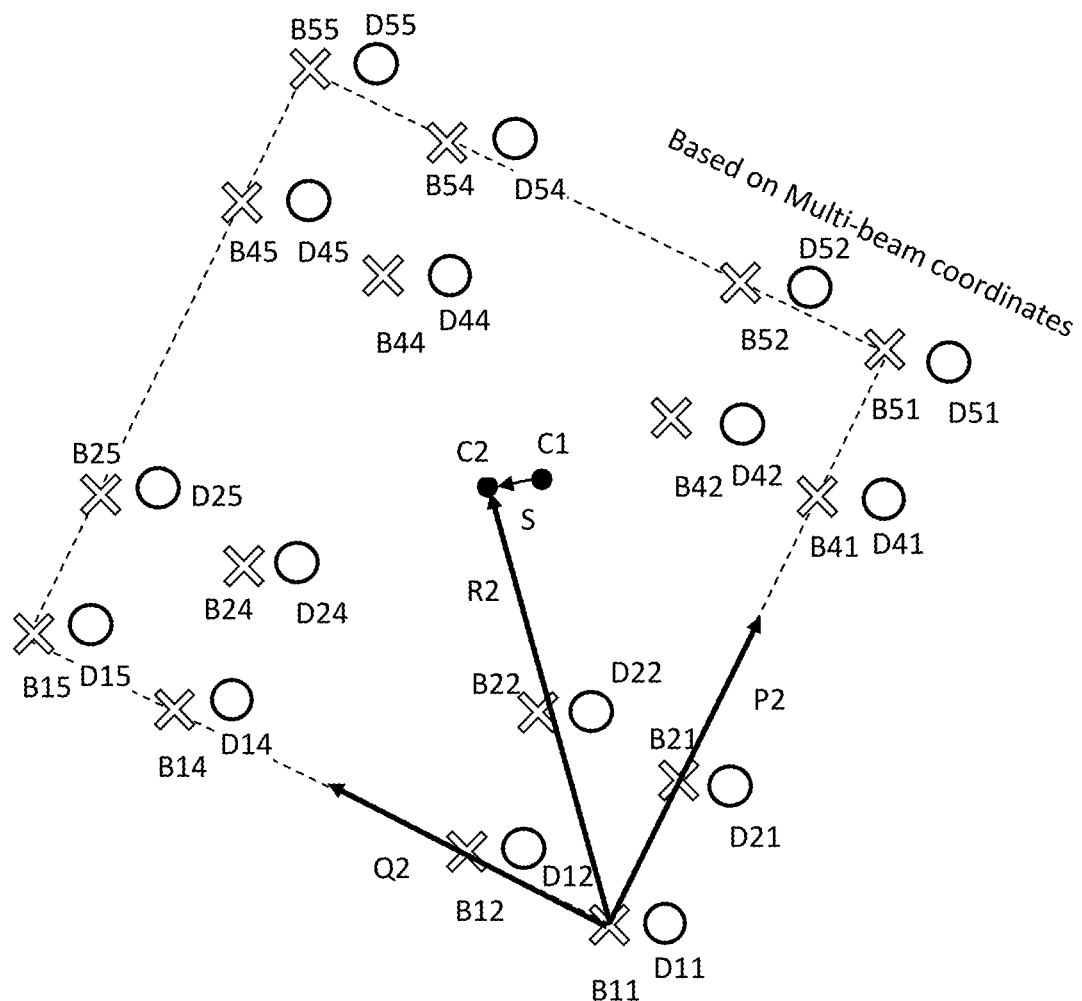
FIG. 19 is an illustration describing a vector calculation method for coordinates of a secondary electron beam according to the first embodiment.

FIG. 19 is an illustration describing a vector calculation method for coordinates of a secondary electron beam according to the first embodiment. In FIG. 19, the corresponding coordinates C2 are obtained as coordinates of a resultant vector (composite vector) of two vectors in the case of applying decomposed two vectors αP2 and βQ2 to coordinates of three secondary electron beams B11, B21, and B12 in multiple secondary electron beams. Specifically, the coordinates-corresponding-to-center calculation unit 72 calculates a resultant vector R2 of αP2 and βQ2, where αP2 is obtained by multiplying a vector P2 from the secondary electron beam B11 corresponding to the detection element D11 being a basis to the secondary electron beam B21 corresponding to the detection element D21 by a vector coefficient α, and where βQ2 is obtained by multiplying a vector Q2 from the secondary electron beam B11 corresponding to the detection element D11 to the secondary electron beam B12 corresponding to the detection element D12 by a vector coefficient β. Then, the coordinates-corresponding-to-center calculation unit 72 calculates coordinates of the resultant vector R2 whose origination is the secondary electron beam B11, as the corresponding coordinates C2.

In the shift amount calculation step (S128), based on a positional relationship between 2×2 beams including a corner beam and 2×2 detection elements before rotation corresponding to the 2×2 beams, the shift amount calculation unit 74 calculates a shift amount S for aligning the plurality of detection elements D11 to D55 of the multi-detector 222 with the multiple secondary electron beams B11 to B55. For example, the shift amount S is calculated in order to align the positions of 2×2 beams including a corner beam with the positions of 2×2 detection elements before rotation corresponding to the 2×2 beams. Specifically, the shift amount S should be calculated such that the sift between the position of the 2×2 beams including a corner beam and the position of the 2×2 detection elements before rotation corresponding to the 2×2 beams is the minimum. Shifting using the shift amount S is effective especially when there is no rotational error between a plurality of detection elements of the multi-detector 222 and the multiple secondary electron beams 300. Alternatively, the shift amount calculation unit 74 calculates a shift amount $S(d_x, d_y)$ for shifting the rotation center coordinates $C1(r_x, r_y)$ to coordinates C2 corresponding to multiple secondary electron beams, for example. Shifting using the shift amount $S(d_x, d_y)$ is effective especially when there is a rotational error between the plurality of detection elements D11 to D55 of the multi-detector 222 and the multiple secondary electron beams B11 to B55.

In the rotation angle calculation step (S130), using one of the positional relationships before and after rotation described above and the rotation center coordinates C1 of the multi-detector 222, the rotation angle calculation unit 76 calculates a rotation angle θ (second rotation angle) for aligning a plurality of detection elements (first detection element) of the multi-detector 222 with the multiple secondary electron beams 300. Specifically, using at least one of already calculated coordinates of the plurality of detection elements D11 to D55 and the rotation center coordinates $(r_x, r_y)$ of the multi-detector 222, the rotation angle calculation unit 76 calculates a rotation angle θ (second rotation angle) for aligning the plurality of detection elements D11 to D55 with the multiple secondary electron beams B11 to B55. Needless to say, if using coordinates of before rotation, the rotation angle is the one rotated from the state before rotation, and if using coordinates after rotation, the rotation angle is the one rotated from the state after rotation.

FIG. 20 is an equation for calculating an alignment angle according to the first embodiment. Detection element coordinates (X, Y) after alignment can be defined by the equation (4) shown in FIG. 20 using detection element coordinates (x, y) before alignment, rotation center coordinates $(r_x, r_y)$, and an unknown rotation angle θ. The unknown rotation angle θ can be obtained by transforming the equation (4). The detection element coordinates (X, Y) after alignment are coincident with the coordinates of a corresponding secondary electron beam.

For increasing the accuracy of the rotation angle θ, it is preferable to obtain the unknown rotation angle θ by using respective coordinates (x1, y1) to (x4, y4) of 2×2 detection elements at a corner. For further increasing the accuracy, it is preferable to obtain the unknown rotation angle θ by using respective coordinates (x1, y1) to (x16, y16) of totally 16 detection elements at four corners.

As described above, the shift amount $(d_x, d_y)$ and the rotation angle θ used for alignment can be obtained.

In the shift step (S132), under the control of the shift processing unit 78, the X-Y stage 228 (movement mechanism) moves, based on the shift amount S, the multi-detector 222 relatively to the multiple secondary electron beams 300. Specifically, the X-Y stage 228 moves the multi-detector 222 in parallel such that the rotation center coordinates C1 is shifted to the corresponding coordinates C2. Here, the multi-detector 222 is mechanically moved.

In the rotation step (S134), under the control of the rotation processing unit 79, the rotary stage 227 (rotation mechanism) rotates the multi-detector 222 by the rotation angle θ.

By the operations described above, the plurality of detection elements D11 to D55 of the multi-detector 222 can be aligned with the multiple secondary electron beams B11 to B55.

In the inspection processing step (S140), the substrate 101 is inspected by the inspection apparatus 100 in which alignment has been performed.

Figure 21:
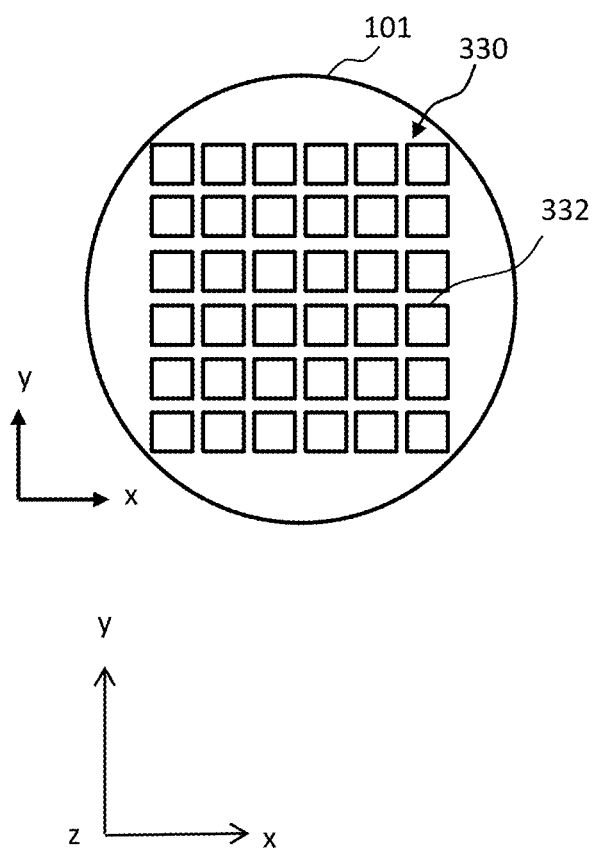
FIG. 21 is an illustration showing an example of a plurality of chip regions formed on a semiconductor substrate according to the first embodiment.

FIG. 21 is an illustration showing an example of a plurality of chip regions formed on a semiconductor substrate, according to the first embodiment. In FIG. 21, in the case of the substrate 101 being a semiconductor substrate (wafer), a plurality of chips (wafer dies) 332 are formed in a two-dimensional array in an inspection region 330 of the semiconductor substrate (wafer). A mask pattern for one chip formed on an exposure mask substrate is reduced to, for example, ¼, and exposed/transferred onto each chip 332 by an exposure device such as a stepper (not shown). The mask pattern for one chip is generally composed of a plurality of figure patterns.

Figure 22:
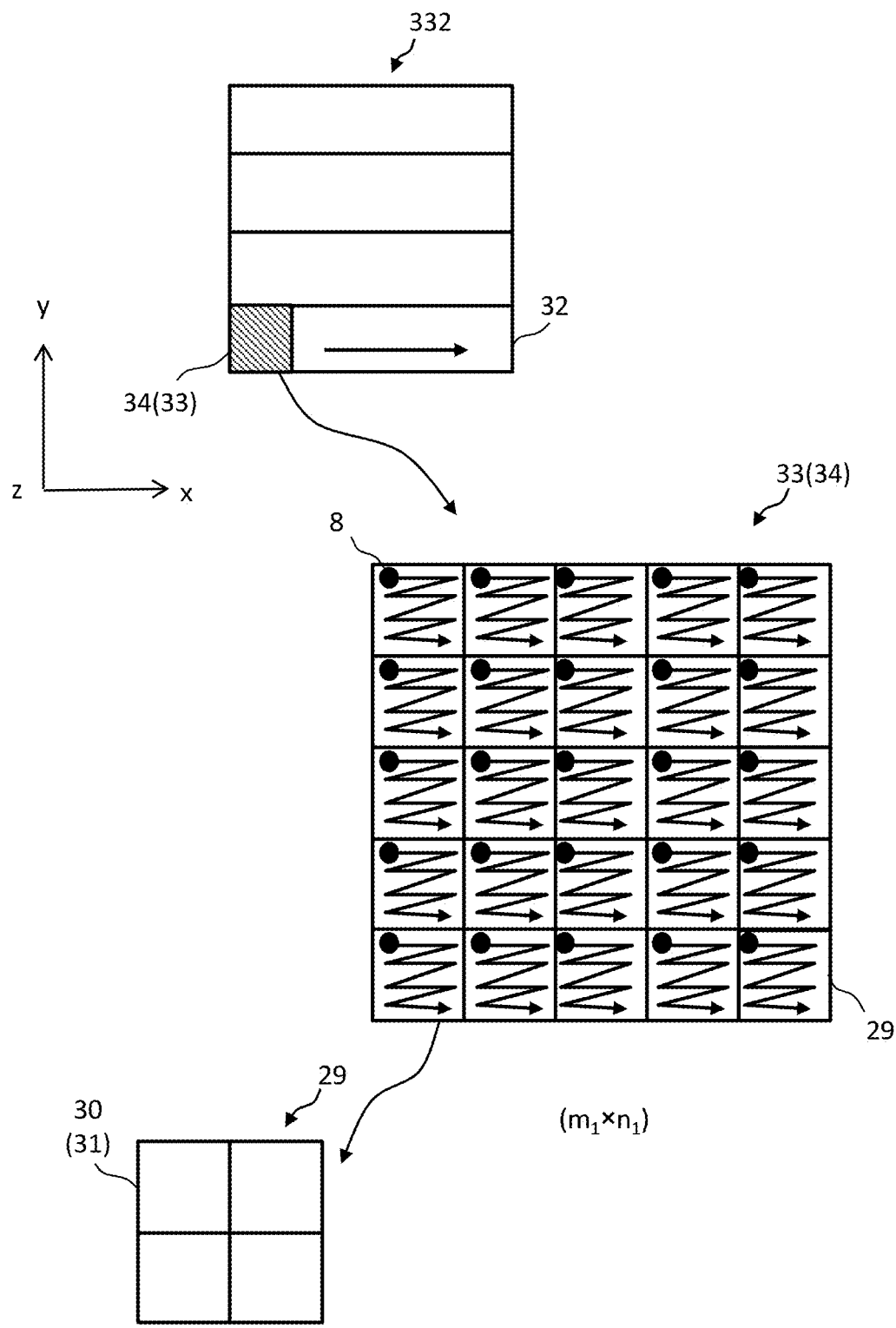
FIG. 22 is an illustration describing inspection processing according to the first embodiment.

FIG. 22 is an illustration describing inspection processing according to the first embodiment. As shown in FIG. 22, the region of each chip 332 is divided, for example, in the y direction into a plurality of stripe regions 32 by a predetermined width. The scanning operation by the image acquisition mechanism 150 is carried out for each stripe region 32, for example. The operation of scanning the stripe region 32 advances relatively in the x direction while the stage 105 is moved in the −x direction, for example. Each stripe region 32 is divided in the longitudinal direction into a plurality of rectangular (including square) regions 33. Beam application to a target rectangular region 33 is achieved by collectively deflecting all the multiple primary electron beams 20 by the main deflector 208.

The case of FIG. 22 shows the multiple primary electron beams 20 of 5 rows×5 columns, for example. The size of an irradiation region 34 which can be irradiated by one irradiation with the multiple primary electron beams 20 is defined by (x direction size obtained by multiplying an x-direction beam pitch of the multiple primary electron beams 20 on the substrate 101 by the number of beams in the x direction)×(y direction size obtained by multiplying a y-direction beam pitch of the multiple primary electron beams 20 on the substrate 101 by the number of beams in the y direction). The irradiation region 34 serves as a field of view of the multiple primary electron beams 20. The inside of a sub-irradiation region 29 is irradiated and scanned with each primary electron beam 8 of the multiple primary electron beams 20, where the sub-irradiation region 29 is surrounded by the beam pitch in the x direction and the beam pitch in the y direction and the beam concerned itself is located therein. Each primary electron beam 8 is associated with any one of the sub-irradiation regions 29 which are different from each other. At the time of each shot, each primary electron beam 8 is applied to the same position in the associated sub-irradiation region 29. The primary electron beam 8 is moved in the sub-irradiation region 29 by collective deflection of all the multiple primary electron beams 20 by the sub deflector 209. By repeating this operation, the inside of one sub-irradiation region 29 is irradiated, in order, with one primary electron beam 8.

Preferably, the width of each stripe region 32 is set to be the same as the size in the y direction of the irradiation region 34, or to be the size reduced by the width of the scanning margin. In the case of FIG. 22, the irradiation region 34 and the rectangular region 33 are of the same size. However, it is not limited thereto. The irradiation region 34 may be smaller than the rectangular region 33, or larger than it. Using each primary electron beam 8 of which the multiple primary electron beams 20 is composed, the sub-irradiation region 29, in which the primary electron beam 8 concerned itself is located, is irradiated and scanned with the primary electron beam 8 concerned. Then, when scanning of one sub-irradiation region 29 is completed, the irradiation position is moved to an adjacent rectangular region 33 in the same stripe region 32 by collectively deflecting all of the multiple primary electron beams 20 by the main deflector 208. By repeating this operation, the inside of the stripe region 32 is irradiated in order. After completing scanning of one stripe region 32, the irradiation region 34 is moved to the next stripe region 32 by moving the stage 105 and/or by collectively deflecting all of the multiple primary electron beams 20 by the main deflector 208. As described above, by irradiation with each primary electron beam 8, the scanning operation per sub-irradiation region 29 and acquisition of a secondary electron image are performed. By combining secondary electron images of respective sub-irradiation regions 29, a secondary electron image of the rectangular region 33, a secondary electron image of the stripe region 32, or a secondary electron image of the chip 332 is configured. When an image comparison is actually performed, the sub-irradiation region 29 in each rectangular region 33 is further divided into a plurality of frame regions 30, and a frame image 31 of each frame region 30 is compared. FIG. 22 shows the case of dividing the sub-irradiation region 29 which is scanned with one primary electron beam 8 into four frame regions 30 by halving it in the x and y directions.

When, while the stage 105 is continuously moving, the substrate 101 is irradiated with the multiple primary electron beams 20, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20. Similarly, when the inside of the sub-irradiation region 29 is scanned, the emission position of each secondary electron beam changes every second in the sub-irradiation region 29. In order to apply each secondary electron beam whose emission position has changed as described above to a corresponding detection region of the multi-detector 222, the deflector 226 collectively deflects the multiple secondary electron beams 300.

As described above, the image acquisition mechanism 150 proceeds with a scanning operation per stripe region 32. An image (secondary electron image) to be used for inspection is acquired by irradiating the substrate 101 on the stage 105 with the multiple primary electron beams 20, and detecting, by the multi-detector 222, the multiple secondary electron beams 300 emitted from the substrate 101 due to the irradiation with the multiple primary electron beams 20. A reflected electron may be included in the detected multiple secondary electron beams 300. Alternatively, a reflected electron may be separated during moving in the secondary electron optical system 152 and therefore may not reach the multi-detector 222. Detected data (measured image data: secondary electron image data: inspection image data) on the secondary electron of each pixel in each sub-irradiation region 29, detected by the multi-detector 222, is output to the detection circuit 106 in order of measurement. In the detection circuit 106, the detected data in analog form is converted into digital data by an A-D converter (not shown), and stored in the chip pattern memory 123. Then, acquired measured image data is transmitted to the comparison circuit 108, together with information on each position from the position circuit 107.

Figure 23:
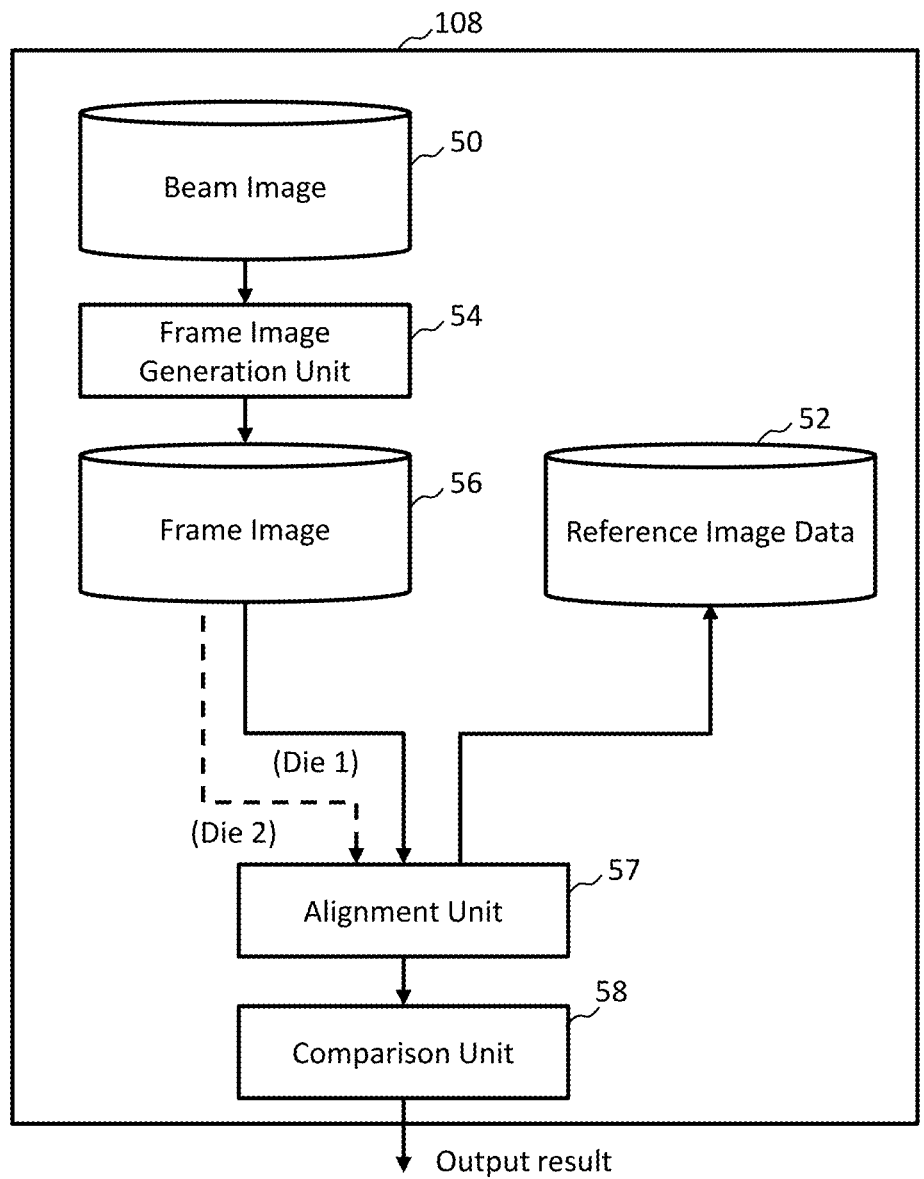
FIG. 23 is a diagram showing an example of an internal configuration of a comparison circuit according to the first embodiment.

FIG. 23 is a diagram showing an example of an internal configuration of a comparison circuit according to the first embodiment. In FIG. 23, storage devices 50, 52 and 56 such as magnetic disk drives, a frame image generation unit 54, an alignment unit 57, and a comparison unit 58 are arranged in the comparison circuit 108. Each of the "units" such as the frame image generation unit 54, the alignment unit 57 and the comparison unit 58 includes processing circuitry. The processing circuitry includes an electric circuit, a computer, a processor, a circuit board, a quantum circuit, a semiconductor device, or the like. Further, common processing circuitry (same processing circuitry), or different processing circuitry (separate processing circuitry) may be used for each of the "units". Input data required in the frame image generation unit 54, the alignment unit 57 and the comparison unit 58, or a calculated result is stored in a memory (not shown) or in the memory 118 each time.

Measured image data (beam image) transmitted into the comparison circuit 108 is stored in the storage device 50.

The frame image generation unit 54 generates the frame image 31 of each of a plurality of frame regions 30 obtained by further dividing image data of the sub-irradiation region 29 acquired by scanning with each primary electron beam 8. The frame region 30 is used as a unit region of an inspection image. In order to prevent missing an image, it is preferable that margin regions overlap each other with respect to respective frame regions 30. The generated frame image 31 is stored in the storage device 56.

On the other hand, the reference image generation circuit 112 generates, for each frame region 30, a reference image corresponding to the frame image 31, based on design data serving as a basis of a plurality of figure patterns formed on the substrate 101. Specifically, it operates as follows: First, design pattern data is read from the storage device 109 through the control computer 110, and each figure pattern defined by the read design pattern data is converted into image data of binary or multiple values.

As described above, basic figures defined by the design pattern data are, for example, rectangles (including squares) and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data serving as the figure data is input to the reference image generation circuit 112, the data is developed into data of each figure, and then, a figure code indicating the figure shape, figure dimensions, and the like of each figure data are interpreted. Then, the reference image generation circuit 112 develops each figure data to design pattern image data of binary or multiple values as a pattern to be arranged in squares in units of grids of predetermined quantization dimensions, and outputs the developed data. In other words, the reference image generation circuit 112 reads design data, calculates the occupancy of a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^8(=1/256)$, the occupancy rate in each pixel is calculated by allocating sub regions each being 1/256 to the region of a figure arranged in the pixel. Then, it becomes 8-bit occupancy data. Such square regions (inspection pixels) can be corresponding to pixels of measured data.

Next, the reference image generation circuit 112 performs filtering processing on design image data of a design pattern which is image data of a figure, using a predetermined filter function. Thereby, it becomes possible to match/fit the design image data being design side image data, whose image intensity (gray scale level) is represented by digital values, with image generation characteristics obtained by irradiation with the multiple primary electron beams 20. Image data for each pixel of a generated reference image is output to the comparison circuit 108. The reference image data transmitted into the comparison circuit 108 is stored in the storage device 52.

Next, the alignment unit 57 reads the frame image 31 serving as an inspection image, and a reference image corresponding to the frame image 31, and provides alignment between both the images, based on units of sub-pixels smaller than units of pixels. For example, the alignment can be performed by a least-square method.

Then, the comparison unit 58 compares a secondary electron image of the substrate 101 placed on the stage 105 with a predetermined image. Specifically, the comparison unit 58 compares, for each pixel, the frame image 31 and the reference image. The comparison unit 58 compares them, for each pixel, based on predetermined determination conditions in order to determine whether there is a defect such as a shape defect. For example, if a difference in gray scale level for each pixel is larger than a determination threshold Th, it is determined that there is a defect. Then, the comparison result is output. It may be output to the storage device 109 or the memory 118, or alternatively, output from the printer 119.

In the examples described above, the die-to-database inspection is performed. However, it is not limited thereto. A die-to-die inspection may be performed. In the case of the die-to-die inspection, alignment and comparison having been described above are carried out between the frame image 31 (die 1) to be inspected and another frame image 31 (die 2) (another example of a reference image) in which there is formed the same pattern as that of the frame image 31 to be inspected.

According to the first embodiment, as described above, it is possible to provide efficient alignment between the multiple secondary electron beams and the secondary electron detector.

Second Embodiment

A second embodiment describes a configuration where alignment is performed by moving the multiple secondary electron beams 300 instead of moving the multi-detector 222. The contents being the same as those of the first embodiment are not specifically described below.

Figure 24:
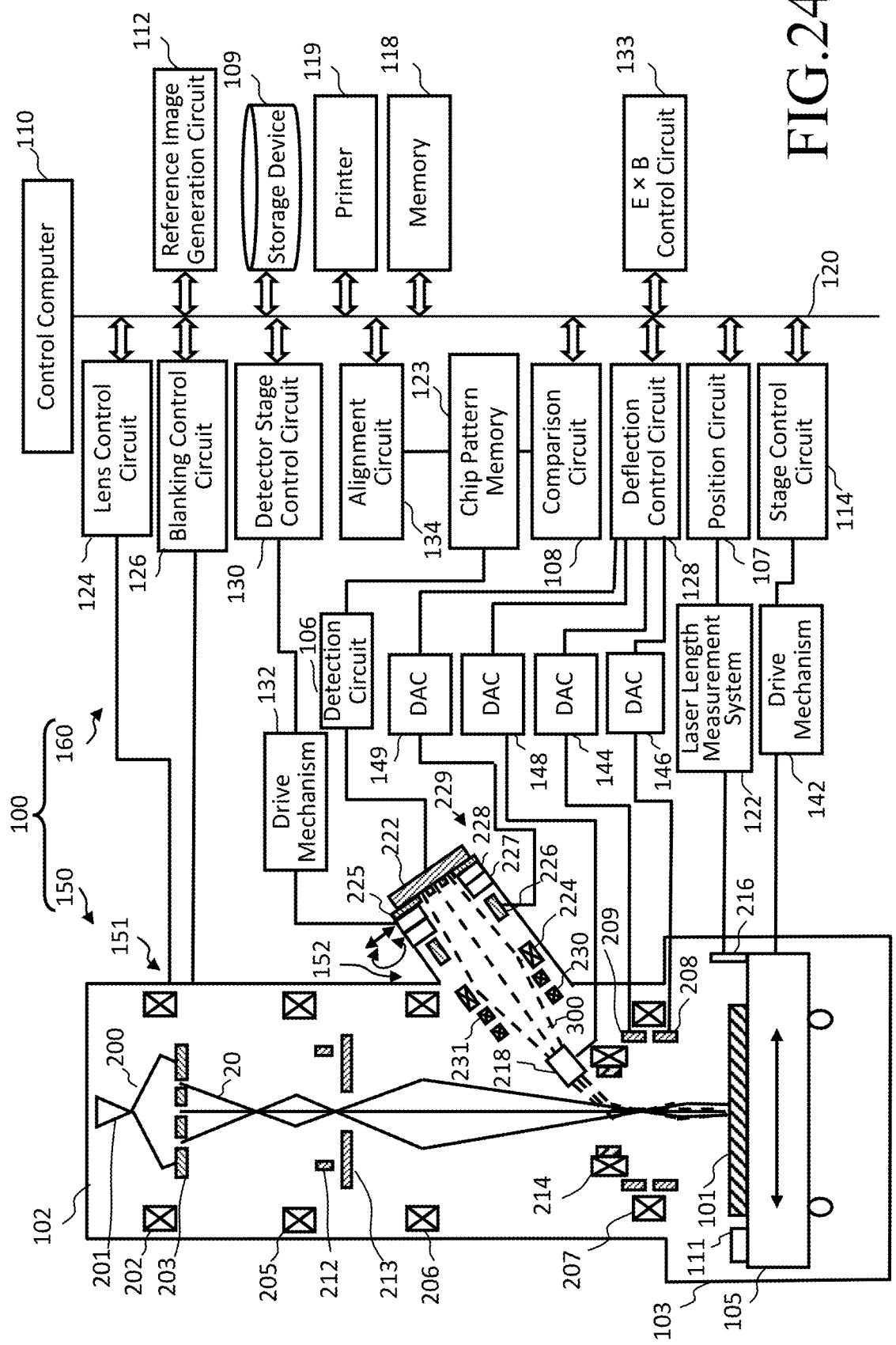
FIG. 24 is a block diagram showing a configuration of an inspection apparatus according to a second embodiment.

FIG. 24 is a block diagram showing a configuration of an inspection apparatus according to the second embodiment. FIG. 24 is the same as FIG. 1 except that alignment coils 230 and 231 are added. The alignment coils 230 and 231 are arranged, for example, on the secondary electron trajectory between the deflector 218 and the electromagnetic lens 224. The alignment coils 230 and 231 are examples of a movement mechanism. In addition, the X-Y stage 228 or the detector stage 229 including the X-Y stage 228 may be omitted in FIG. 24.

According to the second embodiment, in the shift step (S132), the multi-detector 222 is moved relatively to the multiple secondary electron beams 300 by, using a shift amount, shifting the trajectory of the multiple secondary electron beams 300. Specifically, by moving the trajectory central axis of the multiple secondary electron beams 300, using the alignment coils 230 and 231 instead of the X-Y stage 228 which is a part of the detector stage 229, the trajectory central axis of the multiple secondary electron beams 300 is moved in parallel such that the rotation center coordinates C1 is relatively shifted to the corresponding coordinates C2.

As described above, according to the second embodiment, alignment can be provided without mechanically performing parallel movement of the multi-detector 222. Although two alignment coils 230 and 231 are used in the present embodiment, it is also acceptable to use one alignment coil. Further, in the rotation step (S134), the trajectory of the multiple secondary electron beams 300 may be rotated using a magnetic lens or an electromagnetic lens instead of the rotary stage 227 being a part of the detector stage 229.

Third Embodiment

A third embodiment describes a configuration taking into account a beam pitch. The configuration of the inspection apparatus 100 is the same as that of FIG. 1 or FIG. 24. The contents being the same as those of the first embodiment or the second embodiment are not specifically described below.

Figure 25:
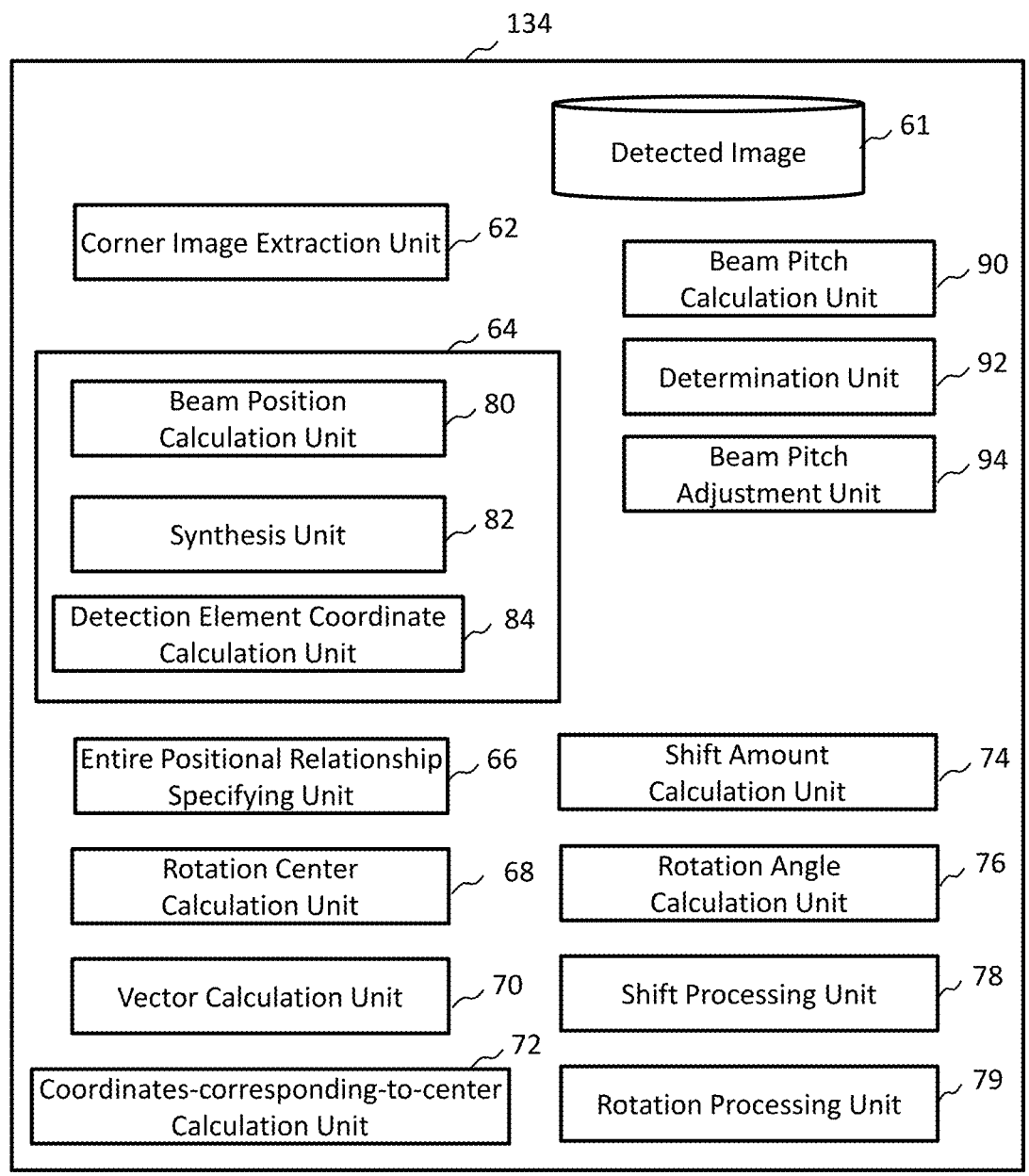
FIG. 25 is a block diagram showing an internal configuration of an alignment circuit according to a third embodiment.

FIG. 25 is a block diagram showing an internal configuration of an alignment circuit according to the third embodiment. FIG. 25 is the same as FIG. 3 except that a beam pitch calculation unit 90, a determination unit 92, and a beam pitch adjustment unit 94 are added.

Each of the "units" such as the corner image extraction unit 62, the corner positional relationship calculation unit 64 (the beam position calculation unit 80, the synthesis unit 82, and the detection element coordinate calculation unit 84), the entire positional relationship specifying unit 66, the rotation center calculation unit 68, the vector calculation unit 70, the coordinates-corresponding-to-center calculation unit 72, the shift amount calculation unit 74, the rotation angle calculation unit 76, the shift processing unit 78, the rotation processing unit 79, the beam pitch calculation unit 90, the determination unit 92, and the beam pitch adjustment unit 94 includes processing circuitry. The processing circuitry includes, for example, an electric circuit, a computer, a processor, a circuit board, a quantum circuit, a semiconductor device, or the like. Further, common processing circuitry (the same processing circuitry), or different processing circuitry (separate processing circuitry) may be used for each of the "units". Input data required in the corner image extraction unit 62, the corner positional relationship calculation unit 64 (the beam position calculation unit 80, the synthesis unit 82, and the detection element coordinate calculation unit 84), the entire positional relationship specifying unit 66, the rotation center calculation unit 68, the vector calculation unit 70, the coordinates-corresponding-to-center calculation unit 72, the shift amount calculation unit 74, the rotation angle calculation unit 76, the shift processing unit 78, the rotation processing unit 79, the beam pitch calculation unit 90, the determination unit 92, and the beam pitch adjustment unit 94, and calculated results are stored in a memory (not shown) or in the memory 118 each time.

Figure 26:
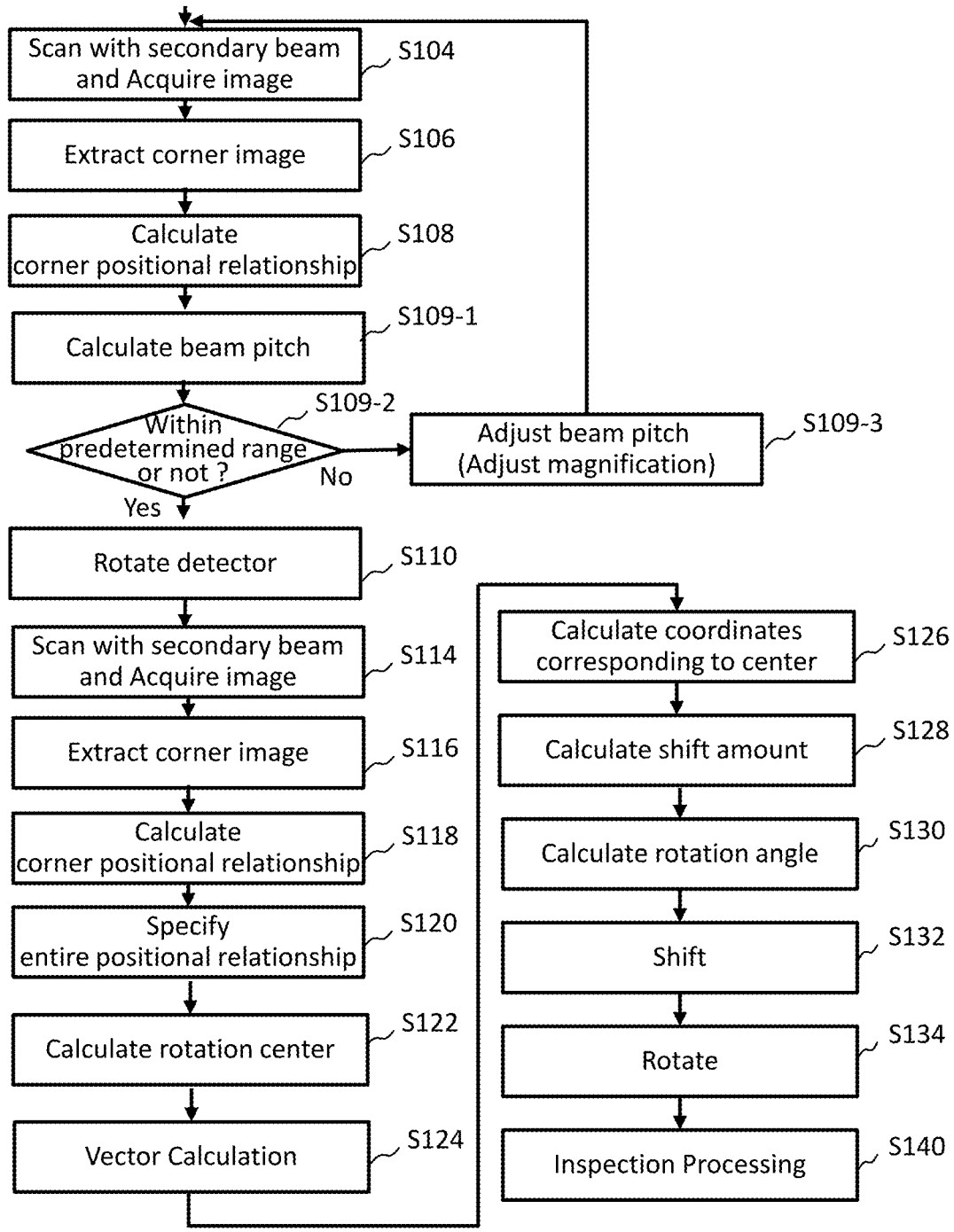
FIG. 26 is a flowchart showing an example of main steps of an inspection method according to the third embodiment.

FIG. 26 is a flowchart showing an example of main steps of an inspection method according to the third embodiment. FIG. 26 is the same as FIG. 4 except that a beam pitch calculation step (S109-1), a determination step (S109-2), and a beam pitch adjustment step (S109-3) are added between the corner positional relationship calculation step (S108) and the detector rotation step (S110).

Alternatively, the beam pitch calculation step (S109-1), the determination step (S109-2), and the beam pitch adjustment step (S109-3) may be added between the entire positional relationship specifying step (S120) and the rotation center calculation step (S122) instead of being added between the corner positional relationship calculation step (S108) and the detector rotation step (S110).

The contents of each step up to the corner positional relationship calculation step (S108) are the same as those of the first embodiment.

In the beam pitch calculation step (S109-1), after specifying one corner positional relationship, the beam pitch calculation unit 90 calculates a beam pitch of the multiple secondary electron beams 300, based on the specified positional relationship. Based on the position of 2×2 beams including a corner beam, the beam pitch can be obtained by calculating a distance between two adjacent beams.

In the determination step (S109-2), the determination unit 92 determines whether a beam pitch P is within a predetermined range. If the beam pitch P is not within the predetermined range, it goes to the beam pitch adjustment step (S109-3). If the beam pitch P is within the predetermined range, it goes to the detector rotation step (S110).

In the beam pitch adjustment step (S109-3), the beam pitch adjustment unit 94 adjusts the beam pitch P. Specifically, the beam pitch adjustment unit 94 outputs a command for controlling the lens control circuit 124. The lens control circuit 124 adjusts the beam pitch P by adjusting the magnification of the multiple secondary electron beams 300 by adjusting the electromagnetic lens 224.

After adjusting the beam pitch, it returns to the secondary beam scan and image acquisition step (S104). Then, each of the steps from the secondary beam scan and image acquisition step (S104) to the beam pitch adjustment step (S109-3) is repeated until the beam pitch P becomes within the predetermined range. The contents of the subsequent steps are the same as those of the first embodiment. Therefore, the shift amount is calculated in the state where the beam pitch is within the predetermined range.

According to the third embodiment, as described above, if, after the coordinates of the multi-detector 222 having been extracted, the beam pitch is in a state shifted from the design value, an alignment flow is progressed after performing a pitch adjustment (magnification adjustment with a lens). Thereby, the alignment is provided with a high accuracy.

Fourth Embodiment

A fourth embodiment describes a configuration considering a beam distribution shape (beam array shape) of the multiple secondary electron beams 300. The contents being the same as those of one of the first to third embodiments are not specifically described below.

Figure 27:
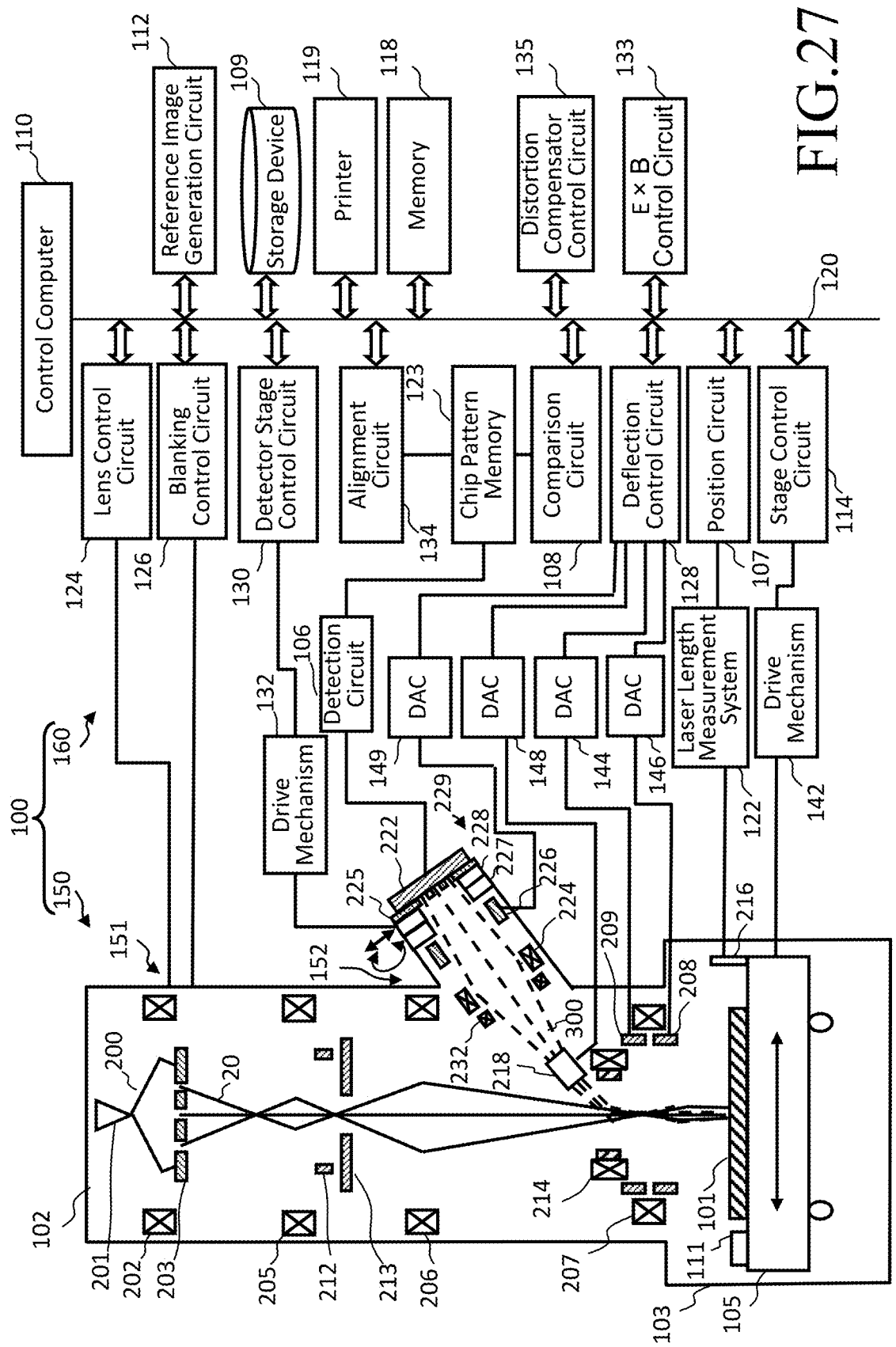
FIG. 27 is a block diagram showing a configuration of an inspection apparatus according to a fourth embodiment.

FIG. 27 is a block diagram showing a configuration of an inspection apparatus according to the fourth embodiment. FIG. 27 is the same as FIG. 1 except that a distortion compensator 232 and a distortion compensator control circuit 135 are added. The distortion compensator 232 is arranged, for example, on the secondary electron trajectory between the deflector 218 and the electromagnetic lens 224. Although FIG. 27 shows the configuration in which the distortion compensator 232 is added to FIG. 1, it is not limited thereto. For example, the distortion compensator 232 may be added to FIG. 24.

The control computer 110 is connected, through the bus 120, to the position circuit 107, the comparison circuit 108, the reference image generation circuit 112, the stage control circuit 114, the lens control circuit 124, the blanking control circuit 126, the deflection control circuit 128, the detector stage control circuit 130, the E×B control circuit 133, the alignment circuit 134, the distortion compensator control circuit 135, the storage device 109, the memory 118, and the printer 119. The distortion compensator 232 is controlled by the distortion compensator control circuit 135.

Figure 28:
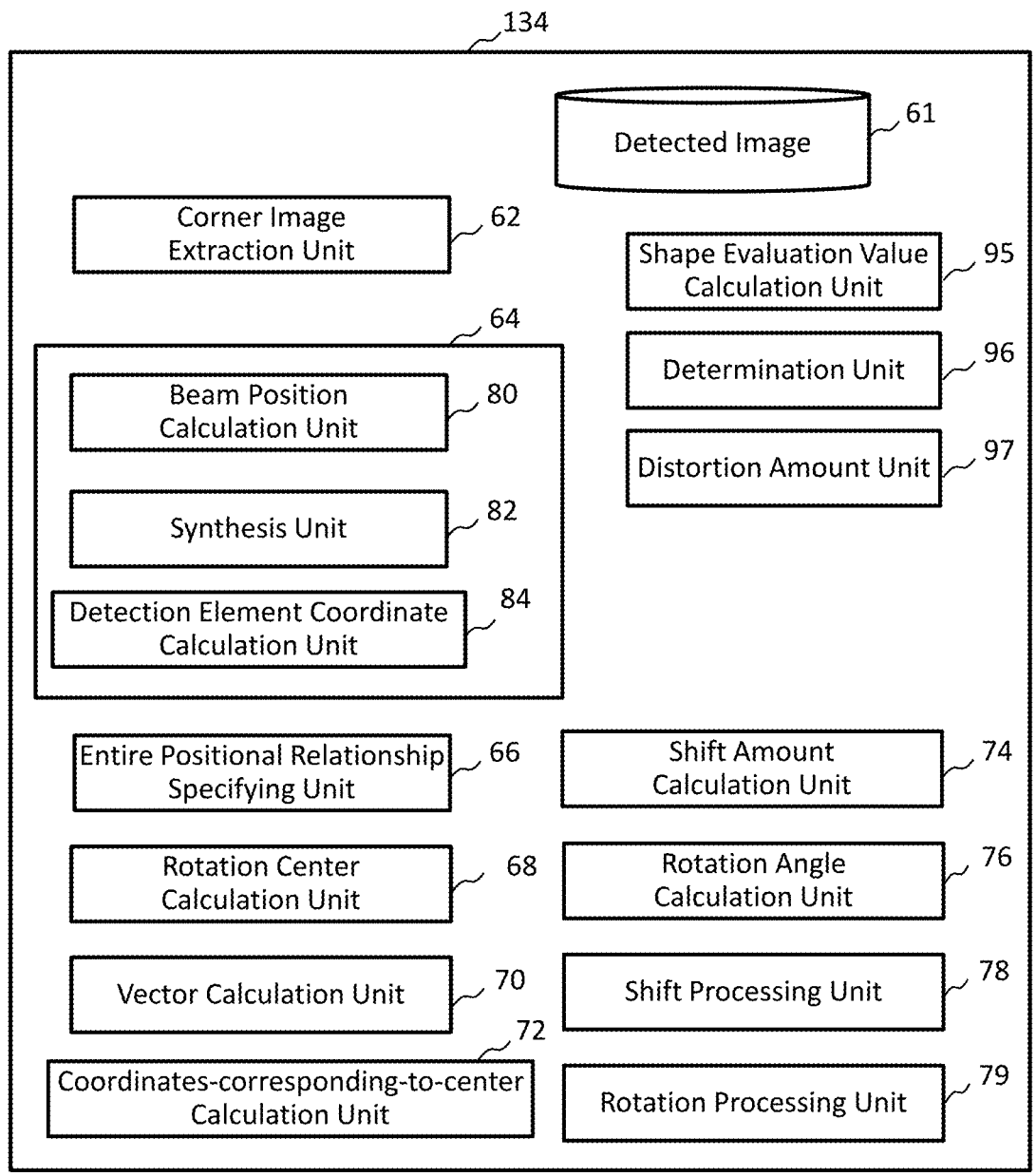
FIG. 28 is a block diagram showing an example of an internal configuration of an alignment circuit according to the fourth embodiment.

FIG. 28 is a block diagram showing an example of an internal configuration of an alignment circuit according to the fourth embodiment. FIG. 28 is the same as FIG. 3 except that a shape evaluation value calculation unit 95, a determination unit 96, and a distortion adjustment unit 97 are added.

Each of the "units" such as the corner image extraction unit 62, the corner positional relationship calculation unit 64 (the beam position calculation unit 80, the synthesis unit 82, and the detection element coordinate calculation unit 84), the entire positional relationship specifying unit 66, the rotation center calculation unit 68, the vector calculation unit 70, the coordinates-corresponding-to-center calculation unit 72, the shift amount calculation unit 74, the rotation angle calculation unit 76, the shift processing unit 78, the rotation processing unit 79, the shape evaluation value calculation unit 95, the determination unit 96, and the distortion adjustment unit 97 includes processing circuitry. The processing circuitry includes, for example, an electric circuit, a computer, a processor, a circuit board, a quantum circuit, a semiconductor device, or the like. Further, common processing circuitry (the same processing circuitry), or different processing circuitry (separate processing circuitry) may be used for each of the "units". Input data required in the corner image extraction unit 62, the corner positional relationship calculation unit 64 (the beam position calculation unit 80, the synthesis unit 82, and the detection element coordinate calculation unit 84), the entire positional relationship specifying unit 66, the rotation center calculation unit 68, the vector calculation unit 70, the coordinates-corresponding-to-center calculation unit 72, the shift amount calculation unit 74, the rotation angle calculation unit 76, the shift processing unit 78, the rotation processing unit 79, the shape evaluation value calculation unit 95, the determination unit 96, and the distortion adjustment unit 97, and calculated results are stored in a memory (not shown) or in the memory 118 each time.

Figure 29:
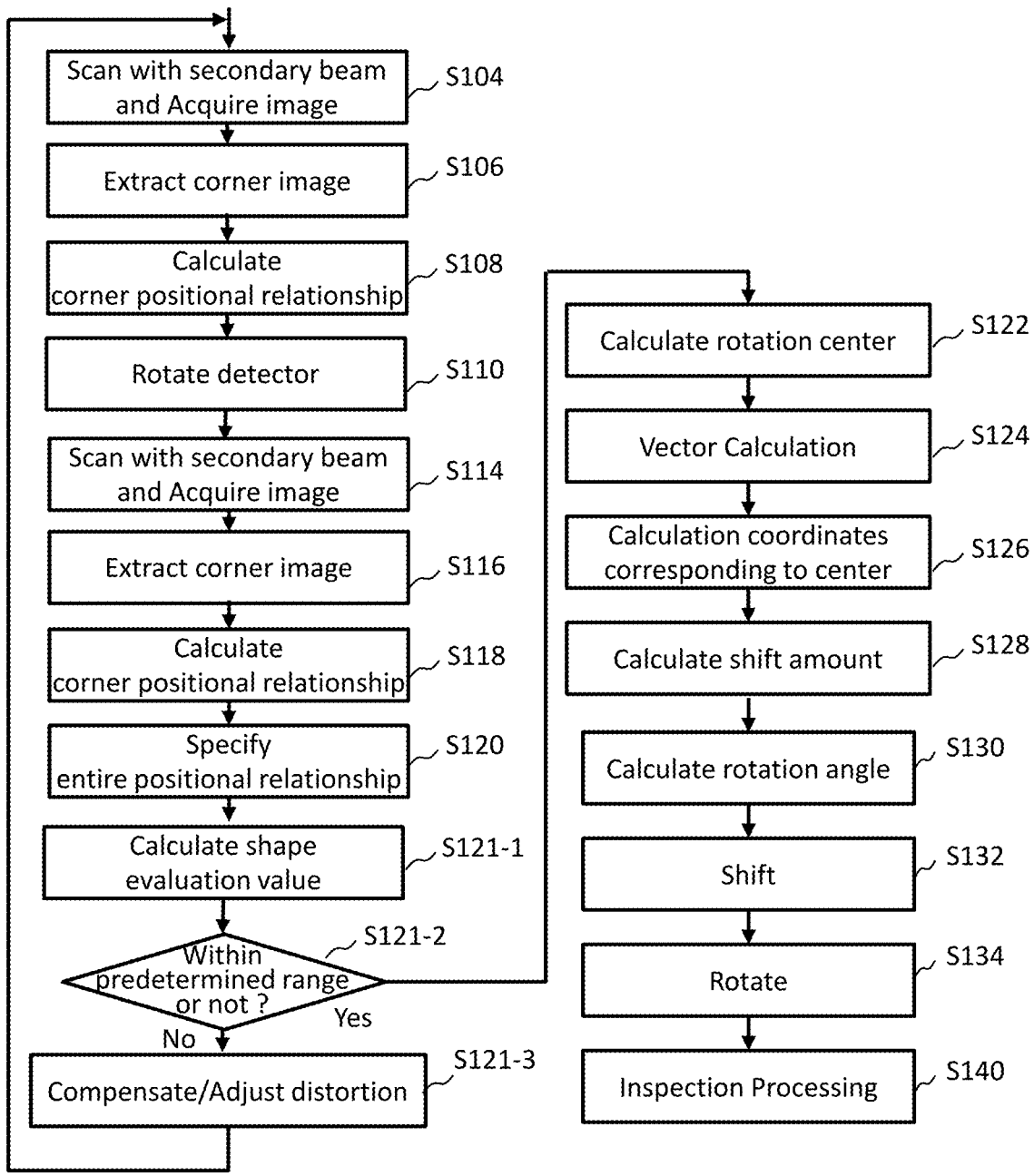
FIG. 29 is a flowchart showing an example of main steps of an inspection method according to the fourth embodiment.

FIG. 29 is a flowchart showing an example of main steps of an inspection method according to the fourth embodiment. FIG. 29 is the same as FIG. 4 except that a shape evaluation value calculation step (S121-1), a determination step (S121-2), and a distortion adjustment step (S121-3) are added between the entire positional relationship specifying step (S120) and the rotation center calculation step (S122).

The contents of each step up to the entire positional relationship specifying step (S120) are the same as those of the first embodiment.

In the shape evaluation value calculation step (S121-1), after specifying an entire positional relationship, the beam distribution shape of the multiple secondary electron beams 300 is evaluated. Specifically, the shape evaluation value calculation unit 95 calculates a shape evaluation value Eval.

Figure 30:
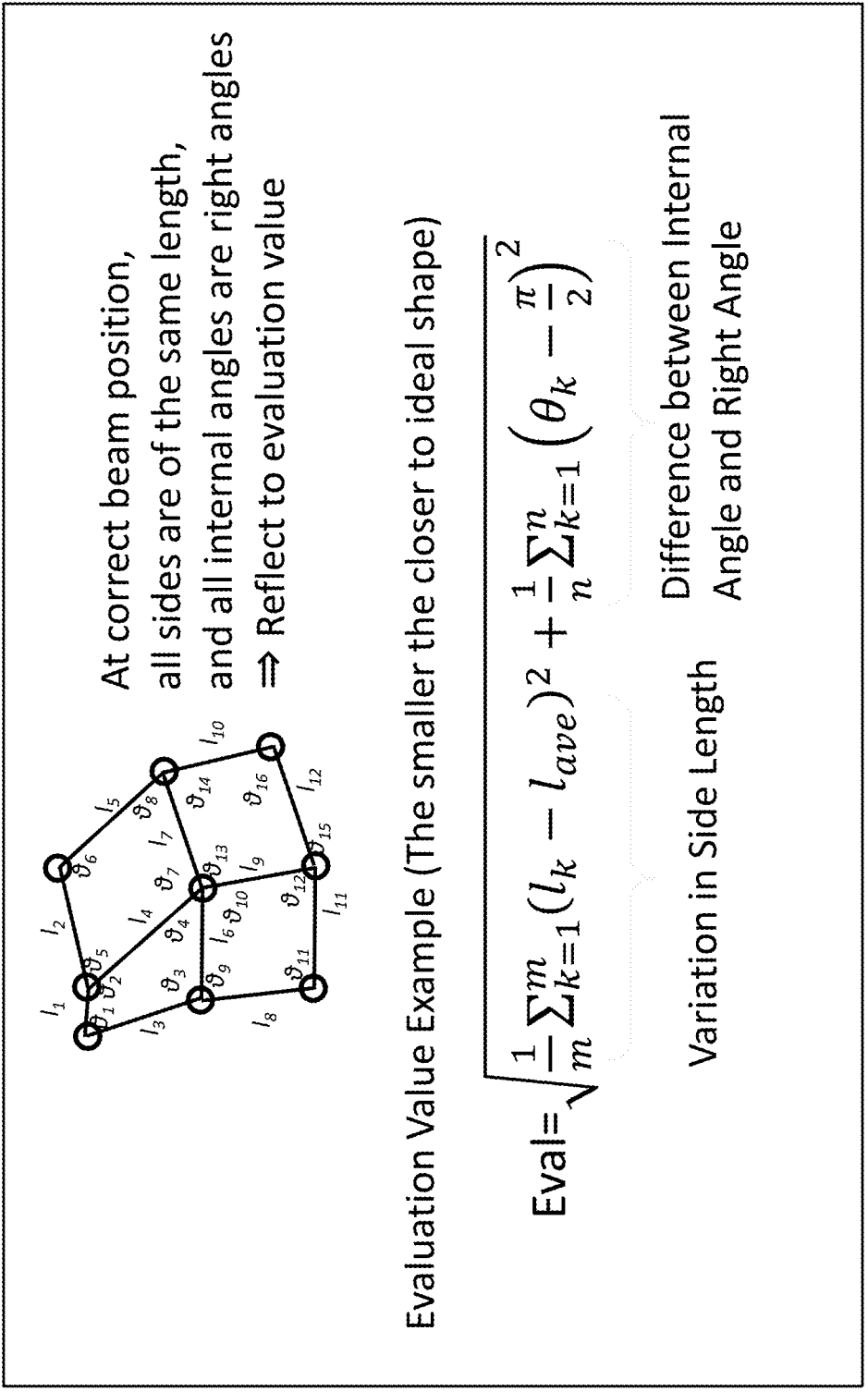
FIG. 30 is an illustration describing a method for calculating a shape evaluation value according to the fourth embodiment.

FIG. 30 is an illustration describing a method for calculating a shape evaluation value according to the fourth embodiment. FIG. 30 shows positions of the multiple secondary electron beams 300 of 3×3 beams, for example. As shown in FIG. 30, each internal angle $\theta_k$ of four rectangles each being surrounded by four side lengths $l_k$ obtained by linking adjacent beams is calculated based on information on the position of each beam. Then, the shape evaluation value calculation unit 95 calculates a shape evaluation value Eval by the equation shown in FIG. 30 using a length $l_k$ of each side and an internal angle $\theta_k$ of each of rectangles.

In the determination step (S121-2), the determination unit 96 determines whether the beam distribution shape of the multiple secondary electron beams 300 is within a predetermined range. Specifically, the determination unit 96 determines whether a shape evaluation value Eval is within the predetermined range. When the shape evaluation value Eval is not within the predetermined range, it goes to the distortion adjustment step (S121-3). When the shape evaluation value Eval is within the predetermined range, it goes to the rotation center calculation step (S122).

In the distortion adjustment step (S121-3), the distortion adjustment unit 97 adjusts the beam distribution shape of the multiple secondary electron beams 300. Specifically, the distortion adjustment unit 97 outputs a command for controlling the distortion compensator control circuit 135. The distortion compensator control circuit 135 adjusts the beam distribution shape of the multiple secondary electron beams 300 by adjusting an excitation of the distortion compensator 232.

Figure 31:
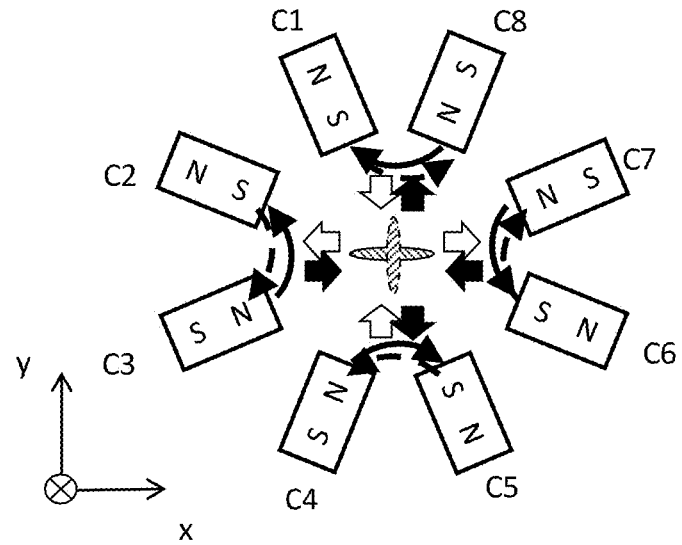
FIG. 31 is an illustration showing an example of the configuration of a distortion compensator and an example of an adjustment method according to the fourth embodiment.

FIG. 31 is an illustration showing an example of the configuration of a distortion compensator and an example of an adjustment method according to the fourth embodiment. In FIG. 31, the distortion compensator 232 is composed of eight magnetic poles C1 to C8, for example. The eight magnetic poles are arranged to surround the multiple secondary electron beams 300. FIG. 31 shows an excited state where, on the center side, each of C1, C2, C5, and C6 has the S polarity, and each of C3, C4, C7 and C8 has the N polarity. In that case, a magnetic field is generated in the direction shown by the solid line. Thereby, a Lorentz force acts in the pulling direction with respect to the x direction, and in the pressing direction with respect to the y direction. Therefore, the beam distribution shape is compensated to extend in the x direction and to contract in the y direction. If the excitation direction of the eight magnetic poles is reversed, a magnetic field is generated in the direction shown by a dotted line. Thereby, a Lorentz force acts in the pulling direction with respect to the y direction, and in the pressing direction with respect to the x direction. Therefore, the beam distribution shape is compensated to extend in the y direction and to contract in the x direction.

Figure 32:
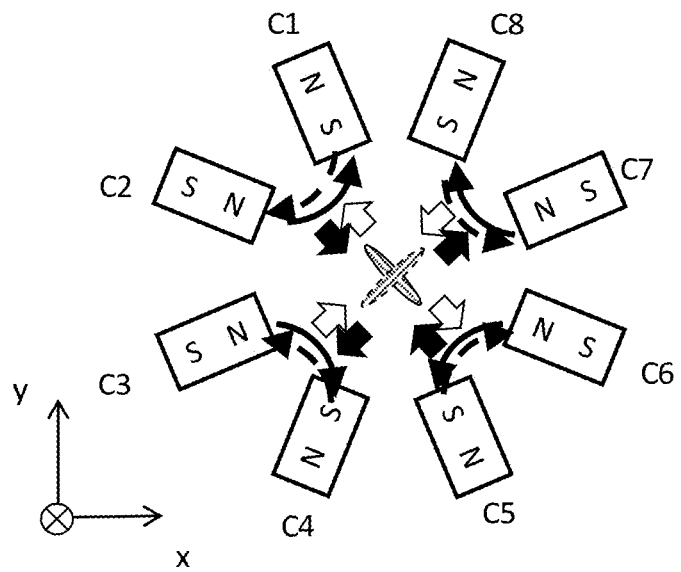
FIG. 32 is an illustration showing another example of the configuration of a distortion compensator and another example of an adjustment method according to the fourth embodiment.

FIG. 32 is an illustration showing another example of the configuration of a distortion compensator and another example of an adjustment method according to the fourth embodiment. In FIG. 32, similarly to FIG. 31, the distortion compensator 232 is composed of the eight magnetic poles C1 to C8, for example. FIG. 32 shows an excited state where, on the center side, each of C1, C4, C5, and C8 has the S polarity, and each of C2, C3, C6 and C7 has the N polarity. In that case, a magnetic field is generated in the direction shown by a solid line. Thereby, a Lorentz force acts in the pulling direction with respect to directions of 135° and −315° to the x direction, and in the pressing direction with respect to directions of 45° and −225° to the x direction. Therefore, the beam distribution shape is compensated to extend in the directions of 135° and −315°, and to contract in the directions of 45° and −225°. If the excitation direction of the eight magnetic poles is reversed, a magnetic field is generated in the direction shown by a dotted line. Thereby, a Lorentz force acts in the pulling direction with respect to directions of 45° and −225°, and in the pressing direction with respect to directions of 135° and −315°. Therefore, the beam distribution shape is compensated to extend in the directions of 45° and −225°, and to contract in the directions of 135° and −315°.

After adjusting the beam distribution shape, it returns to the secondary beam scan and image acquisition step (S104), and each of the steps from the secondary beam scan and image acquisition step (S104) to the distortion adjustment step (S121-3) is repeated until the beam distribution shape becomes within the predetermined range. The contents of the subsequent steps are the same as those of the first embodiment. Therefore, the shift amount is calculated in the state where the shape evaluation value is within the predetermined range.

According to the fourth embodiment, as described above, if, after the entire positional relationship having been specified, the beam distribution shape is in a state shifted from the design value, an alignment flow is progressed after performing distortion adjustment. Thereby, the alignment is provided with a high accuracy.

In the above description, each " . . . circuit" includes processing circuitry. The processing circuitry includes an electric circuit, a computer, a processor, a circuit board, a quantum circuit, a semiconductor device, or the like. Each " . . . circuit" may use common processing circuitry (the same processing circuitry), or different processing circuitry (separate processing circuitry). Programs for causing a processor, etc. to execute processing may be stored in a recording medium, such as a magnetic disk drive, magnetic tape drive, FD, ROM (Read Only Memory) or the like. For example, the position circuit 107, the comparison circuit 108, the reference image generation circuit 112, the stage control circuit 114, the lens control circuit 124, the blanking control circuit 126, the deflection control circuit 128, the detector stage control circuit 130, the E×B control circuit 133, and the alignment circuit 134 may be configured by at least one processing circuit described above. For example, processing in these circuits may be carried out by the control computer 110.

Embodiments have been explained referring to specific examples as described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by applying a primary electron beam from each of a plurality of irradiation sources.

While the apparatus configuration, control method, and the like not directly necessary for explaining the present invention are not described, some or all of them can be appropriately selected and used on a case-by-case basis when needed.

Further, any other multiple secondary electron beam alignment method, multiple secondary electron beam alignment apparatus, and electron beam inspection apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple secondary electron beam alignment method comprising:
scanning a plurality of first detection elements of a multi-detector, which are arrayed in a grid, with multiple secondary electron beams emitted from a surface of a target object on a stage;
detecting a plurality of beams including a corner beam located at a corner in the multiple secondary electron beams by each of a plurality of second detection elements in the plurality of first detection elements;
calculating a positional relationship between the plurality of beams including the corner beam and the plurality of second detection elements, which have detected the plurality of beams including the corner beam, in the plurality of first detection elements;
calculating, based on the positional relationship, a shift amount for aligning the plurality of first detection elements with the multiple secondary electron beams; and
moving, using the shift amount, the multi-detector relatively to the multiple secondary electron beams.

2. The method according to claim 1, further comprising:
calculating a rotation angle for aligning the plurality of first detection elements with the multiple secondary electron beams, by using the positional relationship and rotation center coordinates of the multi-detector; and
rotating, by the rotation angle, the multi-detector relatively to the multiple secondary electron beams.

3. The method according to claim 1, further comprising:
rotating the multi-detector by a first rotation angle;
scanning, in a state after the rotating the multi-detector, the plurality of first detection elements with the multiple secondary electron beams emitted from the surface of the target object;
detecting, in the state after the rotating the multi-detector, the plurality of beams including the corner beam by the multi-detector;
calculating a positional relationship between the plurality of beams including the corner beam, and the plurality of second detection elements in the state after the rotating the multi-detector;
calculating rotation center coordinates of the multi-detector, based on the first rotation angle by which the multi-detector has been rotated, the positional relationship before the rotating the multi-detector, and the positional relationship after the rotating the multi-detector;
calculating a second rotation angle for aligning the plurality of first detection elements with the multiple secondary electron beams, using one of the positional relationship before the rotating the multi-detector and the positional relationship after the rotating the multi-detector, and the rotation center coordinates of the multi-detector; and
rotating the multi-detector by the second rotation angle relatively to the multiple secondary electron beams.

4. The method according to claim 1, wherein, in a case of the scanning with the multiple secondary electron beams, a scanning range being at least four times a beam pitch between the multiple secondary electron beams is scanned.

5. The method according to claim 1, wherein, the multi-detector is moved relatively to the multiple secondary electron beams by shifting, using the shift amount, a trajectory of the multiple secondary electron beams.

6. The method according to claim 1, further comprising:
calculating, based on the positional relationship, a beam pitch between the multiple secondary electron beams;
determining whether the beam pitch is within a predetermined range; and
adjusting the beam pitch in a case in which the beam pitch is not within the predetermined range, wherein the shift amount is calculated in a state in which the beam pitch is within the predetermined range.

7. The method according to claim 1, further comprising:
calculating an entire positional relationship between entire the multiple secondary electron beams and entire the plurality of first detection elements;
calculating, based on the entire positional relationship, a shape evaluation value for evaluating a beam distribution shape of the multiple secondary electron beams;
determining whether the shape evaluation value is within a predetermined range; and
adjusting, in a case of the shape evaluation value not being within the predetermined range, the beam distribution shape of the multiple secondary electron beams, wherein
the shift amount is calculated in a state where the shape evaluation value is within the predetermined range.

8. The method according to claim 1, wherein the multi-detector is moved mechanically.

9. A multiple secondary electron beam alignment apparatus comprising:
a stage;
an electron optical system configured to irradiate a surface of a target object on the stage with multiple primary electron beams;
a multi-detector configured to include a plurality of first detection elements arrayed in a grid, and to detect a plurality of beams including a corner beam located at a corner in multiple secondary electron beams emitted from the surface of the target object due to irradiation with the multiple primary electron beams by each of a plurality of second detection elements in the plurality of first detection elements;
a deflector configured to scan the plurality of first detection elements with the multiple secondary electron beams;
a positional relationship calculation circuit configured to calculate a positional relationship between the plurality of beams including the corner beam and the plurality of second detection elements, which have detected the plurality of beams, in the plurality of first detection elements;
a shift amount calculation circuit configured to calculate, based on the positional relationship, a shift amount for aligning the plurality of first detection elements with the multiple secondary electron beams; and
a movement mechanism configured to move, using the shift amount, the multi-detector relatively to the multiple secondary electron beams.

10. The apparatus according to claim 9, further comprising:
a rotation angle calculation circuit configured to calculate a rotation angle for aligning the plurality of first detection elements with the multiple secondary electron beams, by using the positional relationship and rotation center coordinates of the multi-detector; and
a rotation mechanism configured to rotate, by the rotation angle, the multi-detector relatively to the multiple secondary electron beams.

11. An electron beam inspection apparatus comprising:
a stage;
an electron optical system configured to irradiate a surface of a target object on the stage with multiple primary electron beams;
a multi-detector configured to include a plurality of first detection elements arrayed in a grid, and to detect a plurality of beams including a corner beam located at a corner in multiple secondary electron beams emitted from the surface of the target object due to irradiation with the multiple primary electron beams by each of a plurality of second detection elements in the plurality of first detection elements;
a deflector configured to scan the plurality of first detection elements with the multiple secondary electron beams;
a positional relationship calculation circuit configured to calculate a positional relationship between the plurality of beams including the corner beam and the plurality of second detection elements, which have detected the plurality of beams, in the plurality of first detection elements;
a shift amount calculation circuit configured to calculate, based on the positional relationship, a shift amount for aligning the plurality of first detection elements with the multiple secondary electron beams;
a movement mechanism configured to move, using the shift amount, the multi-detector relatively to the multiple secondary electron beams; and
a comparison circuit configured to compare a secondary electron image of an inspection substrate placed on the stage with a predetermined image, wherein
the secondary electron image is acquired by irradiating the inspection substrate on the stage with multiple primary electron beams, and detecting, by the multi-detector, the multiple secondary electron beams emitted from the inspection substrate due to the irradiating with the multiple primary electron beams.

* * * * *